(12) United States Patent
Kostamo et al.

(10) Patent No.: US 10,982,325 B2
(45) Date of Patent: Apr. 20, 2021

(54) FLUID DISTRIBUTING DEVICE FOR A THIN-FILM DEPOSITION APPARATUS, RELATED APPARATUS AND METHODS

(71) Applicant: PICOSUN OY, Espoo (FI)

(72) Inventors: Juhana Kostamo, Espoo (FI); Timo Vähä-Ojala, Espoo (FI); Tom Blomberg, Espoo (FI); Marko Pudas, Espoo (FI)

(73) Assignee: PICOSUN OY, Espoo (FI)

( * ) Notice: Subject to any disclaimer, the term of this patent is extended or adjusted under 35 U.S.C. 154(b) by 0 days.

(21) Appl. No.: 17/029,320

(22) Filed: Sep. 23, 2020

(65) Prior Publication Data

US 2021/0087682 A1    Mar. 25, 2021

(30) Foreign Application Priority Data

Sep. 24, 2019 (FI) .................................. 20195809

(51) Int. Cl.
*H01J 37/32* (2006.01)
*C23C 16/455* (2006.01)
(Continued)

(52) U.S. Cl.
CPC .... *C23C 16/45504* (2013.01); *C23C 16/4412* (2013.01); *C23C 16/45514* (2013.01);
(Continued)

(58) Field of Classification Search
CPC ........ C23C 16/45504; C23C 16/45514; C23C 16/45544; C23C 16/515; C23C 16/4412;
(Continued)

(56) References Cited

U.S. PATENT DOCUMENTS 5,455,070 A * 10/1995 Anderson ............. C23C 16/455
427/248.1
5,916,369 A *  6/1999 Anderson ............. C23C 16/455
118/715

(Continued)

FOREIGN PATENT DOCUMENTS

EP    1 420 080    5/2004
EP    3 396 731    10/2018
(Continued)

OTHER PUBLICATIONS

FI Office Action for FI20195809 dated Jan. 24, 2020, 4 pages.
FI Search Report for FI20195809 dated Jan. 24, 2020, 2 pages.

*Primary Examiner* — Rudy Zervigon
(74) *Attorney, Agent, or Firm* — Nixon & Vanderhye

(57) ABSTRACT

A thin-film deposition apparatus, related systems and methods are provided. The thin-film deposition apparatus 200 comprises a reaction chamber 201 for accommodating substrates 10 arranged with their side faces adjacent to each other and a fluid distribution device 100 with an expansion region 101 into which precursor fluid(s) enter via a number of inlets 103, and a transition region 102 for mixing said fluids. From the transition region, fluidic flow is directed into the reaction chamber 201 to propagate between the substrates 10 in a strictly laminar manner. By the invention, uniformity of precursor distribution on the substrates can be markedly improved.

31 Claims, 11 Drawing Sheets

(51) Int. Cl.
*C23C 16/515* (2006.01)
*C23C 16/44* (2006.01)
*H01L 39/24* (2006.01)

(52) U.S. Cl.
CPC .. *C23C 16/45536* (2013.01); *C23C 16/45544* (2013.01); *C23C 16/515* (2013.01); *H01J 37/32431* (2013.01); *H01L 39/2438* (2013.01)

(58) Field of Classification Search
CPC ........... C23C 16/45536; H01L 39/2438; H01J 37/32431
USPC ................ 118/715; 156/345.33, 345.34
See application file for complete search history.

(56) References Cited

U.S. PATENT DOCUMENTS

| | | | | |
|---|---|---|---|---|
| 6,263,829 B1* | 7/2001 | Schneider | C23C 16/455 | 118/723 E |
| 6,500,734 B2* | 12/2002 | Anderson | C23C 16/45504 | 438/478 |
| 6,814,811 B2* | 11/2004 | Ose | C23C 16/45561 | 118/715 |
| 7,020,981 B2* | 4/2006 | Shero | C23C 16/4412 | 118/715 |
| 7,163,587 B2* | 1/2007 | Kinnard | C23C 16/455 | 118/641 |
| 7,749,326 B2* | 7/2010 | Kim | C23C 16/45589 | 118/715 |
| 8,056,500 B2* | 11/2011 | Tseng | H01L 21/67115 | 118/641 |
| 8,118,935 B2* | 2/2012 | Yamada | C23C 16/45502 | 118/715 |
| 8,277,561 B2* | 10/2012 | Kim | C23C 16/45582 | 118/715 |
| 8,282,735 B2* | 10/2012 | Choi | H01L 21/68792 | 118/715 |
| 8,282,768 B1* | 10/2012 | Smargiassi | H01L 21/02348 | 156/345.33 |
| 8,298,338 B2* | 10/2012 | Kim | C23C 16/45591 | 118/715 |
| 8,303,712 B2* | 11/2012 | Nakashima | H01L 21/67017 | 118/715 |
| 8,329,593 B2* | 12/2012 | Yousif | H01J 37/32357 | 438/725 |
| 8,545,940 B2* | 10/2013 | Choi | C23C 16/45527 | 427/255.15 |
| 8,663,390 B2* | 3/2014 | Carlson | C23C 16/455 | 118/724 |
| 8,888,087 B2* | 11/2014 | Okabe | C23C 16/4584 | 269/289 R |
| 8,980,005 B2* | 3/2015 | Carlson | C23C 16/45574 | 118/715 |
| 9,499,905 B2* | 11/2016 | Samir | C23C 16/45568 | |
| 9,620,395 B2* | 4/2017 | Yang | C30B 35/00 | |
| 9,695,508 B2* | 7/2017 | Carlson | C23C 16/45574 | |
| 9,869,019 B2* | 1/2018 | Yang | C23C 16/505 | |
| 10,046,969 B2* | 8/2018 | Shibuya | B82Y 30/00 | |
| 10,240,232 B2* | 3/2019 | Liang | C23C 16/4412 | |
| 10,381,461 B2* | 8/2019 | Cho | C23C 16/45574 | |
| 10,590,530 B2* | 3/2020 | Liang | C23C 16/45574 | |
| 10,752,991 B2* | 8/2020 | Shono | H01L 21/67017 | |
| 2002/0189543 A1* | 12/2002 | Biberger | H01L 21/6715 | 118/715 |
| 2003/0164143 A1 | 9/2003 | Toyoda et al. | | |
| 2005/0000651 A1* | 1/2005 | Biberger | H01L 21/67748 | 156/345.1 |
| 2007/0170148 A1* | 7/2007 | Kuppurao | C30B 29/06 | 216/58 |
| 2008/0092812 A1* | 4/2008 | McDiarmid | H01L 21/67017 | 118/695 |
| 2008/0210163 A1* | 9/2008 | Carlson | C23C 16/455 | 118/715 |
| 2009/0163042 A1* | 6/2009 | Tseng | H01L 21/67098 | 438/795 |
| 2009/0165713 A1* | 7/2009 | Kim | C23C 16/45504 | 118/719 |
| 2009/0260569 A1* | 10/2009 | Kim | C23C 16/45585 | 118/715 |
| 2009/0260572 A1* | 10/2009 | Kim | C23C 16/45508 | 118/730 |
| 2009/0288604 A1* | 11/2009 | Kim | C23C 16/45512 | 118/726 |
| 2010/0048032 A1 | 2/2010 | Sangam et al. | | |
| 2013/0180453 A1* | 7/2013 | Je | C23C 16/507 | 118/723 R |
| 2014/0290573 A1* | 10/2014 | Okabe | H01L 21/68742 | 118/500 |
| 2014/0345528 A1* | 11/2014 | Yang | C23C 16/505 | 118/723 I |
| 2014/0345801 A1* | 11/2014 | Yang | H01L 21/67069 | 156/345.27 |
| 2017/0088950 A1* | 3/2017 | Noro | C23C 16/455 | |

FOREIGN PATENT DOCUMENTS

| | | |
|---|---|---|
| WO | 2009/130375 | 10/2009 |
| WO | 2010/027669 | 3/2010 |
| WO | 2018/202949 | 11/2018 |
| WO | 2018/234611 | 12/2018 |

* cited by examiner

FLUID DISTRIBUTING DEVICE FOR A THIN-FILM DEPOSITION APPARATUS, RELATED APPARATUS AND METHODS

This application claims priority to FI Patent Application No. 20195809 filed Sep. 24, 2019, the entire contents of which are hereby incorporated by reference.

FIELD OF THE INVENTION

The present invention generally relates to thin-layer deposition methods and associated equipment. In particular, the present invention concerns a fluid distributing device for a thin-film deposition reactor to establish a laminar flow of fluids in a reaction space.

BACKGROUND

Thin-film deposition methods, wherein thin film coatings are deposited on substrates from a vapor phase are extensively described in the art. Atomic Layer Deposition (ALD) technology generally regarded as a subclass of Chemical Vapor Deposition (CVD) has proved its efficiency in manufacturing high-quality conformal coatings on three-dimensional substrate structures.

ALD is based on alternating self-saturative surface reactions, wherein different reactants (precursors) provided as chemical compounds or elements in a nonreactive (inert) gaseous carrier are sequentially pulsed into a reaction space accommodating a substrate. Deposition of a reactant is followed by purging the substrate by inert gas. Conventional ALD cycle proceeds in two half-reactions (pulse first precursor—purge; pulse second precursor—purge), whereby a layer of material is formed in a self-limiting (self-saturating) manner, typically being 0.05-0.2 nm thick.

During each pulse, a specific precursor chemical is injected into inert (carrier) fluid continuously flowing via a reaction space. Pulses are separated by purge periods, whereupon the reaction space is purged by said carrier gas to remove the precursor chemical from the preceding pulse. In a deposition run, the cycle or cycles is/are repeated as many times as required for obtaining a film with a predetermined thickness. Typical substrate exposure time for each precursor ranges within 0.01-1 seconds (per pulse). Common precursors include metal oxides, elemental metals, metal nitrides and metal sulfides.

One common drawback that may have an adverse influence on quality of films produced by chemical deposition methods, in particular, by ALD, is a non-conformal flow profile when introducing reactive (precursor) substances into the reaction space. Prominent shape features of the reaction chamber and a variety of protruding structures in the reaction space may disturb the flow and cause vorticity and/or turbulence. In such devices, the flow profile tends to switch from laminar to turbulent or vice versa, as even minor changes in the fluid flow (in terms of time, velocity, chemical composition, etc.) are likely to affect the flow profile in an unpredictable manner.

Deposition times are mainly limited by long purging periods. In order to optimize deposition speed (in terms of time per deposition cycle, such as 0.5-20 seconds per deposition cycle, for example), fluidic flow through the deposition reactors should be as even as possible. In ALD, turbulence is likely to slow evacuation of pulsed chemicals that results in incomplete purge, whereupon the first precursor remains in the reaction space upon delivery of the second precursor thereto. The undesirable situation arises, when the second precursor reacts with the first precursor in a gas phase, which leads to particle formation. At worst scenario, such situation ruins the samples to be coated. In any case, presence of two precursors in the ALD reaction instead of one is likely to result in particle formation, coating non-uniformity and poor quality of the film, with such properties of the film impaired as electrical breakthrough voltage and increase particles.

In this regard, an update in the field of thin-film deposition technology is still desired, in view of addressing challenges associated with avoiding turbulence while providing efficient mixing of precursors in the thin-film deposition reactors.

SUMMARY OF THE INVENTION

An objective of the present invention is to solve or to at least alleviate each of the problems arising from the limitations and disadvantages of the related art. The objective is achieved by various embodiments of a fluid distributing device for a thin film deposition apparatus, a related apparatus, system and method. Thereby, in one aspect of the invention, a thin-film deposition apparatus is provided according to what is defined in the independent claim 1.

In embodiment, the apparatus comprises: a reaction chamber for accommodating substrates arranged with their side faces adjacent to each other; and a fluid distributing device, comprising an expansion region with sub-regions into which fluid streams F1, F2 are received via at least one inlet arranged on each sub-region such that said fluid streams F1, F2 propagate through the sub-regions in directions essentially towards one another, and a transition region, in which fluid streams F1, F2 arriving thereto via the sub-regions combine; wherein each sub-region has an interior with a distance thereacross increasing on a cross-sectional plane between each inlet and the transition region to an expansion width D1 in a direction of fluid flow F1, F2; and wherein the transition region is configured to further direct a combined fluid stream into the reaction chamber, such that a flow F established at an entrance to the reaction chamber and propagating through the length of said reaction chamber, between the side faces of the substrates, is laminar.

In embodiment, the thin-film deposition apparatus comprises the fluid distributing device, in which a fluidic flow established in the interior of each sub-region at a distance between the inlet and the transition region is laminar.

In embodiment, the transition region is a channel with an entrance and an exit provided as openings having a width d2, d2' and a length that extends at the distance D1 corresponding to the expansion width of each sub-region.

In embodiment, the transition region 102 further comprises a constriction zone formed by inclination of lateral surfaces of the channel to a width d3 essentially constant at the distance D1.

In embodiment, at least a portion of said channel has lateral surfaces inclined at a curvature.

In embodiment, the sub-regions of the expansion region are disposed at a cross-sectional plane P1 essentially orthogonal to a longitudinal axis Y of the deposition apparatus.

In embodiment, the direction of the fluid streams F1, F2 propagating through the expansion region is essentially perpendicular to the direction of fluid flow F propagating through the reaction chamber.

In embodiment, the sub-regions of the expansion region are each disposed at cross-sectional planes P1' and wherein each such plane P1' is inclined by an angle alpha, a with regard to the cross-sectional plane P1. In embodiment, said cross-sectional planes P1' are mirror-symmetrical.

In embodiment, at the transition region each fluid stream F1, F2 makes a turn from the cross-sectional plane P1, P1' to a cross-sectional plane P2 defined as a plane of symmetry for the sub-regions along the longitudinal axis Y of the deposition apparatus.

In embodiment, the fluid distributing device, further comprises a flow-shaping element configured to adjust a flow direction of fluid streams F1, F2 entering the transition region essentially towards the reaction chamber. In embodiment, the fluid distributing device further comprises a mixing arrangement in the transition region.

In embodiment, the reaction chamber of said apparatus has a constant cross-section throughout its length.

In embodiment, in said apparatus, the transition region is established by a channel with an entrance opening and an exit opening, and wherein said entrance opening and/or said exit opening have the same cross-section as the reaction chamber.

In embodiment, an interior of the reaction chamber of said apparatus dimensionally conforms to a predetermined number of substrates received thereinto.

In embodiment, the apparatus is configured to deposit material on substrate surfaces by establishing a laminar flow F of a precursor fluid through the length of the reaction chamber, wherein the precursor fluid propagates between the side faces of said substrates with essentially uniform velocity at a leading edge.

In embodiment, in said apparatus, the precursor fluid delivered into the reaction chamber comprises at least one precursor chemical.

In embodiment, the precursor fluid is delivered into the reaction chamber of said apparatus in a number of sequential pulses.

In embodiment, the apparatus is configured to deposit a coating film simultaneously on all substrate surfaces.

In embodiment, the apparatus further comprises an exhaust conduit and an enclosure arranged essentially around said exhaust conduit and receiving fluid flowing from the reaction chamber through the conduit, wherein said exhaust conduit and said enclosure form an exhaust assembly configured to alter a direction of exhaust flow exiting the reaction chamber. In embodiment, in said exhaust assembly, the exhaust conduit and the enclosure form a passage, in which exhaust flow exiting the reaction chamber via the exhaust conduit makes a turn around a wall or walls forming said conduit, while remaining in the enclosure, to be further directed into an exhaust manifold via an aperture arranged on at least one side wall of the enclosure.

In embodiment, the apparatus is configured as an apparatus for chemical deposition reactions. In embodiment, said apparatus is configured as an apparatus for Atomic Layer Deposition (ALD).

In further aspect a method for depositing material on substrate surfaces in an apparatus for thin-film deposition is provided according to what is defined in the independent claim 26.

In still further aspect, use of the apparatus for thin film deposition, according to some previous aspect, is provided for depositing thin films of coating material on the substrate surfaces, according to what is defined in the independent claim 28.

In still further aspect, a thin-film deposition system comprising a number of apparatuses for thin film deposition, according to some previous aspect, is provided, according to what is defined in the independent claim 29. In embodiment, the apparatuses in said system are connected to one another in sequence and/or in an array.

In embodiment, the apparatuses are arranged in said system such, as to receive a common precursor compound into at least two apparatuses.

In some other aspect, a method for uniform distribution of fluids in an apparatus for thin-film deposition, according to some previous aspect, is provided according to what is defined in the independent claim 31.

In some configurations, a fluid distributing device for the thin-film deposition apparatus is further provided, comprising an expansion region comprising sub-regions for receiving fluid streams F1, F2 via at least one inlet arranged on each sub-region such that said fluid streams F1, F2 propagate through the sub-regions in directions essentially towards one another, and a transition region, in which fluid streams F1, F2 arriving thereto via the sub-regions combine, wherein each sub-region has an interior with a distance thereacross increasing on a cross-sectional plane between each inlet and the transition region to an expansion width D1 in a direction of fluid flow F1, F2; and wherein the transition region is configured to direct a combined fluid stream into a reaction chamber of the deposition apparatus, such that a flow F established at an entrance to the reaction chamber and propagating through the length of said reaction chamber is laminar.

The utility of the present invention arises from a variety of reasons depending on each particular embodiment thereof. Overall, the invention offers devices and methods for efficient mixing of precursor chemicals in the deposition apparatus and, at the same time, for establishing laminar flow conditions in chemical deposition reactions. Avoiding voracity in ALD reactions allows for creating high-quality films with improved thickness uniformity. By establishing and controlling laminar flow profiles, the invention allows for shortening purging periods and for speeding-up the overall production process.

In ALD implementation, laminar flow is maintained during both pulse- and purge phases. Establishing laminar flow conditions in purge phase allows for more efficient removal of fluids, such as gases, from the reaction space and for reducing time periods required for purging a predetermined (reaction chamber) volume, accordingly. Thus, fluid flowing laminar into the reaction space steadily and evenly "pushes away" precursor compounds and/or reaction products remaining, in the gaseous phase, from a preceding pulse.

In solutions that do not support laminar flow (prior art), concentration of said precursor compounds and/or reaction products in the reaction space is typically reduced by "diluting" with inert fluid. However, due to essentially turbulent flow conditions purging of the reaction chamber may last for a very long time (over 1 min, for example). In the apparatus presented hereby laminar flow conditions, established at an entrance to the reaction chamber and maintained upon propagating fluids through said reaction chamber, are close to that observed in laminar plugflow reactors.

The fluid distributing device according to present invention allows for keeping precursor chemicals, that arriving into the reaction chamber from the different sources, separated from one another thus effectively preventing said chemicals from mixing- and/or reacting with each other until they reach a predetermined space in the reactor apparatus. Film formation on the reactor surfaces preceding the reaction chamber is thus avoided. In the apparatus, precursor chemicals are guided straight into the reaction chamber without being allowed to reside on the undesired surfaces (due to untimely/too early mixing).

In the apparatus presently disclosed, propagation of precursor compounds through the reaction space occurs one precursor at a time, which is made possible by improved flow velocity characteristics enabled, in turn, by the innovative configuration. The apparatus thus allows for avoiding problems commonly arising in the shower head reactors, for example, and associated with the so called CVD-type reactions (based on directing at least two precursors into the reaction space simultaneously) in the ALD reactors (based on subsequent directing the precursors in the reaction space so that chemicals do not mix).

Upon conducting chemical deposition reactions in the apparatus according to the present disclosure, all substrates, such as wafer substrates, in the reaction chamber become deposited with a uniform layer of precursor so that the concentration of precursor is uniform across the individual substrate (side) surface and across the surfaces of all substrates in the reaction space. Due to its capacity to uniformly mix precursor chemicals and spread said mixed chemicals evenly onto all substrates surfaces, the amount of precursor chemical(s) directed into the reaction space in each pulse can be minimized. This allows for saving chemicals, for reducing film formation in the feedline(s) and for minimizing purge periods.

The apparatus further operates without pressure losses.

In the present disclosure, materials with a layer thickness below 1 micrometer ($\mu m$) are referred to as "thin films".

The expressions "reactive fluid" and "precursor fluids" are indicative in the present disclosure of a fluidic flow comprising at least one chemical compound (a precursor compound), hereafter, a precursor, in an inert carrier.

The expression "a number of" refers in the present disclosure to any positive integer starting from one (1), e.g. to one, two, or three. The expression "a plurality of" refers herein to any positive integer starting from two (2), e.g. to two, three, or four.

The terms "first" and "second" are not intended to denote any order, quantity, or importance, but rather are used to merely distinguish one element from another, unless explicitly stated otherwise.

The expression "a number of" refers in the present disclosure to any positive integer starting from one (1), e.g. to one, two, or three. The expression "a plurality of" refers herein to any positive integer starting from two (2), e.g. to two, three, or four.

Some components on the figures presented hereby are not necessary drawn to scale.

DETAILED DESCRIPTION OF THE DRAWINGS

Figure 1:
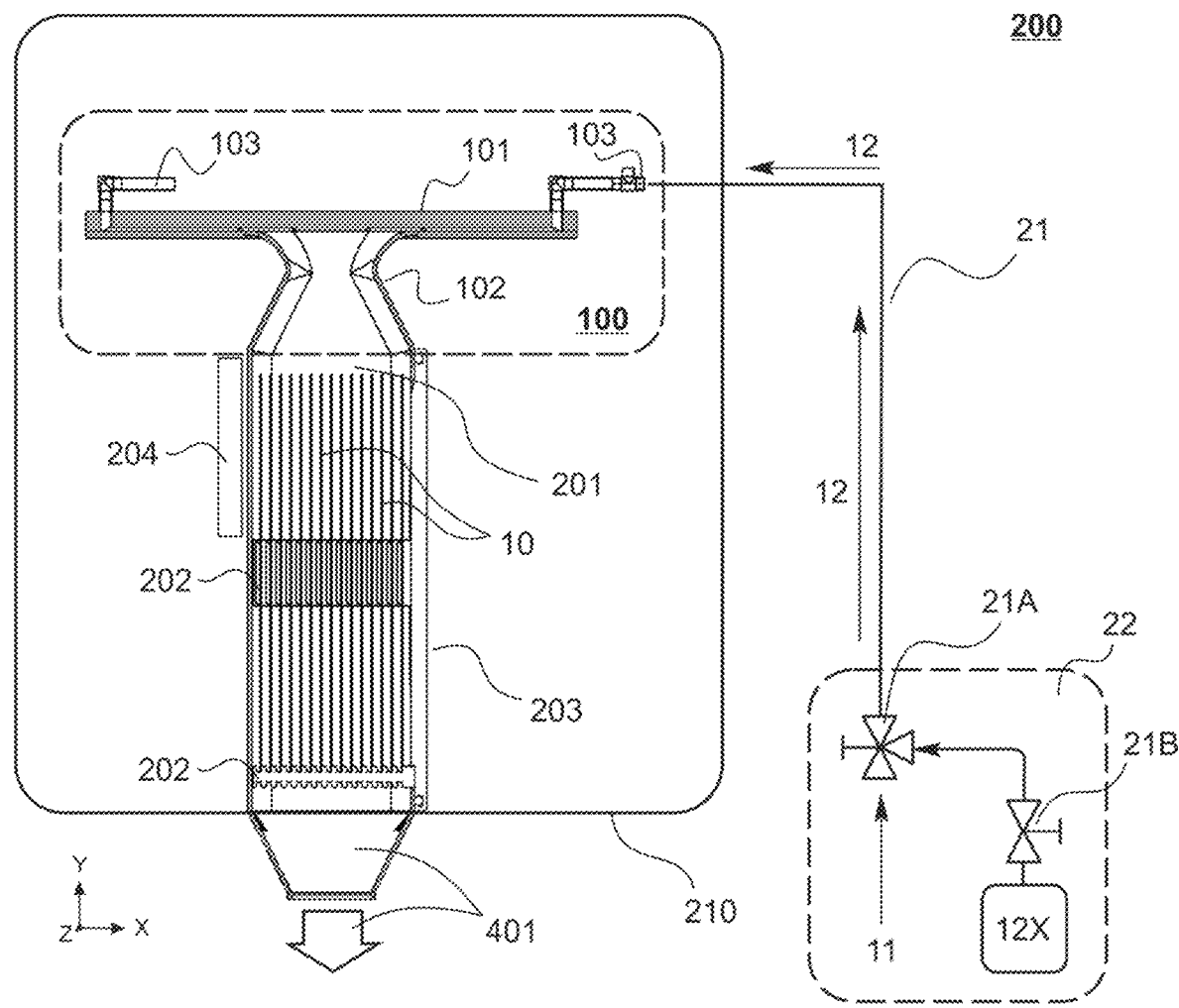
FIG. 1 schematically illustrate a thin-film deposition reactor 200 according to an embodiment.

Detailed embodiments of the present invention are disclosed herein with the reference to accompanying drawings. The same reference characters are used throughout the drawings to refer to same members. Following citations are used for the members:

100—a fluid distributing device;
101—an expansion region;
101-1, 101-2—sub-regions of the expansion region;
102—a transition region established by a channel 102A-102B;
102A, 102B—an entrance opening and an exit opening, accordingly (transition region);
103—an inlet;
104—a constriction region;
105—a flow-shaping element;
106—a mixing arrangement;
107—a plasma generating arrangement;
110—a cover part for the expansion region;
112, 121—interior lateral surfaces of the channel 102A-102B;
200—a deposition apparatus;
201—a reaction chamber;
202—a substrate holder;
203—a door;
204—a heater;
210—a vacuum chamber;
10—a substrate;
11—inert (carrier) fluid;
12—precursor fluid;
12X, 12A-12G—precursors, optionally in corresponding containers (precursor sources);
21—a precursor fluid intake line;
21A—a precursor fluid flow regulating device;
21B—a closing valve for precursor source(s);
22—a valve block;
301—a control system;
40—an exhaust manifold;
41, 41A—an exhaust conduit with an exit aperture, accordingly;
42, 42A—an enclosure fir the exhaust conduit with an exit aperture, accordingly;
43—a feedthrough arrangement for a vacuum pump fore-line;
401—an evacuation line (a vacuum pump fore-line);
500 (500A, 500B, 500C, 500D)—a deposition system FIG. 1 illustrates, at 200, a thin-film deposition apparatus, hereafter, a reactor, in accordance to various embodiments. In all configurations the reactor 200 comprises a fluid distributing device 100 (dashed box) configured to generate a laminar flow of fluid throughout a reaction space incorporating a plurality of substrates 10. The reactor 200 comprises a reaction chamber 201 and a fluid distributing device 100 with an expansion region 101 and a transition region 102, the latter connecting the expansion region 101 with the reaction chamber 201.

The reactor 200 is preferably configured to exploit principles of vapor-deposition based techniques, preferably, those based on chemical vapor deposition (CVD). In preferred embodiments, the reactor 200 is configured as an Atomic Layer Deposition (ALD) device.

In ALD, the at least one substrate is typically exposed to temporally separated precursor pulses in a reaction vessel to deposit material on the substrate surfaces by sequential self-saturating surface reactions. In the context of this application, the term ALD comprises all applicable ALD based techniques and any equivalent or closely related technologies, such as, for example the following ALD sub-types: MLD (Molecular Layer Deposition) plasma-assisted ALD, for example PEALD (Plasma Enhanced Atomic Layer Deposition) and photon-enhanced Atomic Layer Deposition (known also as flash enhanced ALD).

The reactor 200 can be further rendered suitable for physical vapor deposition—(PVD) and for plasma-enhance chemical vapor deposition (PECVD) processes.

FIG. 1 is thus illustrative of an exemplary installation for the thin-film deposition apparatus 200 at a vertical crosscut. The reaction chamber 201 is configured as an elongated vessel with an interior that accommodates a plurality of substrates 10 preferably arranged with their side surfaces facing each other. Flat, planar substrates are preferably utilized, such as plate- or disc-shaped substrate, for example, that can be arranged into a vertical stack (having flat surfaces arranged side-by-side). The substrates 10 can be wafers, such as metal- or silicon wafers, for example. The interior of said reaction chamber 201 forms a reaction space (deposition space).

The substrates 10 can be loaded into the reaction chamber one by one or as a batch. Batch loading is typically preferred. In a non-limiting manner, a substrate holder 202 can be configured for a batch of 1-27 substrates. Some embodiments include a batch of 15 substrates.

In various configurations, the substrate holder 202 can be integrated with a door/a hatch 203 or with the reaction chamber 201. Alternatively, the substrate holder can be provided as a separate, removable part. The substrate holder 202 can be formed by at least one element, such as a rod or a bar, for example, onto which the substrates 10 are arranged (e.g. fitted into groove(s) provided on said rod). In some configurations, the substrate holder 202 comprises means, such as actuator(s), motor(s) and the like, to move, to vibrate and/or to rotate the substrate(s). In such a way, the process of deposition coating onto said substrate(s) can be optimized, in particular, in terms of deposition uniformity.

It is advantageous to rotate disc-shaped substrates, such as wafers, in the reaction space. Rotation speed can be relatively slow, such as half a rotation (180 degrees) per an entire deposition run (that includes all deposition cycles required to deposition the film), or relatively fast, such as one full rotation (360 degrees) during a single chemical pulse. In configuration, where the substrate holder 202 is provided as at least one rod fixed within the reaction space, rotation of the substrate(s) 10 can be implemented by imparting rotating movement to said rod around its center axis. Alternatively, the substrate holder can be implemented as a number of rods secured on a sliding arrangement, such as rail(s) arranged according to an essentially circular track, for example, within the reaction chamber 201 (not shown). In such an event, rotation is performed around the center axis of the substrate(s) 10, by moving the rods (the substrate holder 202) on the essentially circular track.

It is preferred that the substrates 10 in the batch are arranged such that their side faces are equally distanced from one another.

The reaction chamber 201 is configured to closely fit around a batch of substrates received thereinto. Thus, the outermost substrates in the batch (the ones facing the lateral walls of the reaction chamber) are distanced from said lateral walls by essentially the same distance as provided between all substrates in the batch. The reaction chamber is that implemented as a flat, elongated vessel that dimensionally conforms to a predetermined number of substrates 10 received thereinto.

In preferred embodiments, fluid(s) propagate through the reaction chamber 201 along its longitudinal plane. Longitudinal plane of the reaction chamber is the plane that passes from the head (entrance) of the reaction chamber to its tail (exhaust). In present disclosure, the direction from head to tail is referred to as y-direction or a direction along the Y-axis (a longitudinal axis). Fluid flow through the reaction chamber is thus referred to as occurring along the longitudinal plane independent on whether the reactor 200 is positioned vertically or horizontally within the entire installation.

FIG. 1 shows a configuration of the reactor 200 in an upright position that generally allows for propagation of fluids through the reaction chamber 201 along its longitudinal plane in essentially vertical ("top-to-bottom") direction. Configuration, in which the reactor 200 is positioned horizontally, is shown on FIG. 6A.

Substrates are loaded into the reaction chamber 201 via an opening typically shut with the door 203 (FIGS. 1 and 6). Any face of the reaction chamber can be provided with the opening for substrate loading. Depending on whether the reactor 200 is arranged vertically or horizontally, loading can be implemented sideways (FIG. 1), from the bottom (FIG. 6A) or from the top (not shown).

Unless otherwise explicitly provided, the longitudinal plane, longitudinal axis and/or the Y-axis of the apparatus 200 align with the same of the reaction chamber 201.

The reactor 200 further comprises an exhaust (evacuation) line 401 for discharging an exhaust flow, such as excess carrier, precursor and reaction products, out of the reaction chamber 201. The exhaust line 401 constitutes a fore-line for a pump unit and optionally one or more valves (not shown). Configurations, in where the reaction chamber is connected with the exhaust line 401 by an exhaust manifold, are described in more detail further below.

In some instances, it may be preferred that withdrawal of fluidic substances from the reaction chamber is implemented in an uninterrupted manner. Hence, the pump unit can be configured as a vacuum pump for removal of fluidic substances from the reaction chamber continuously during the entire deposition process.

In operation, the apparatus 200 is further provided with an external housing 210 to accommodate the reaction chamber 201. In some instances, an intermediate space established by an interior of said external housing is maintained under vacuum and referred to as a vacuum chamber. Exemplary configurations comprising the vacuum chamber 210 are shown on FIGS. 1 and 6A. Embodiments, in where the external housing optionally configured as the vacuum chamber, incorporates more than one apparatus 200, are described further below.

Mentioned intermediate space 210 can further accommodate a number of heaters/heating elements 204 (FIG. 1). The heating element(s) can be placed such, as to adjoin the reaction chamber or chambers. Additionally or alternatively, a number of heating elements can be integrated into a wall or walls of the vessel that forms the reaction chamber(s) 201. In further, additional or alternative configurations, heating of the reaction space can be implemented by directing pre-heated fluid, such as gas, thereinto, via the feedline 21, for example. In such an event, a number of heating elements can be arranged such, as to adjoin or to encompass the feedline 21 or be incorporated into a pipe forming said feedline (not shown). In further configurations, the heating element(s) can be provided in a separate compartment 22 enclosing valves (FIG. 1).

It is preferred that the reaction chamber 201 is kept under vacuum during operation, loading and unloading, whereupon pressure in the reaction chamber is maintained at a level below 1 kPa (10 mbar), preferably, 10 Pa (0.1 mbar). In some configurations, pressure in the reaction chamber is set-up at the same level as the ambient pressure.

It is further preferred that pressure the intermediate space/the vacuum chamber 210 is maintained at a level of at least 1 kPa (10 mbar). Preferably, pressure in the intermediate space 210 is maintained at a level exceeding 1 kPa, to establish a pressure difference between the interior of the reaction chamber 201 (typically, less than 100 Pa) and the interior of the vacuum chamber 210.

In a number of examples presented further below, the pressure in the intermediate space has been maintained higher in comparison to the reaction chamber. Depending on particular operating parameters, precursors and/or reaction conditions, the pressure in the intermediate space 210 can be further maintained lower than in the reaction chamber 201 or the same as in the reaction chamber.

Precursor fluid(s) 12 is/are delivered into the reactor via a number of intake lines (feedlines) 21 and associated switching and/or regulating devices 21A, such as valves. FIG. 1 is illustrative of the embodiment, in which precursor fluid 12 is delivered inside the reaction chamber 201 by means of at least one feedline 21. In some instances, it is preferred that the reactor 200 comprises two, three or more feedlines 21 (not shown). In some configurations, the apparatus may comprise a manifold feedline and a distributing pipework connectable to a variety of precursor sources and an inert gas supply or supplies (not shown). In some alternative configurations, provision of the feedline(s) can be omitted by connecting the valve(s) 21A directly to the fluid distributing device 100.

It is preferred that the precursor fluid 12 delivered into the reaction chamber comprises at least one precursor compound 12X, provided as any one of 12A, 12B, 12C, 12D, 12E, 12F, and 12G.

Precursor(s) are delivered into the feedline 21 in a fluidic form. Reactive fluid 12 flowing through the feedline 21 is preferably a gaseous substance comprising a predetermined precursor chemical 12X carried by an inert carrier 11. Precursor(s) are supplied into the feedline 21 from a supply source or sources configured as containers, cartridges or a piping system, for example. Each source preferably contains a predetermined precursor 12X provided as a chemical compound, a molecule or an element. Each source is equipped with at least one valve 21B, provided as a manual closing valve, for example. A variety of precursor chemicals required for deposition reaction(s), such as ALD reaction(s), can be directed into the reaction space via a single feedline 21.

In some instances, precursor(s) 12X are provided in a gaseous form, such as ammonia gas ($NH_3$). In some other instances, precursor(s) are provided in liquid or solid forms and vaporized prior to being admixed to the inert carrier.

Inert carrier 11 is a fluid, preferably gas, such as nitrogen ($N_2$), argon (Ar) or any other suitable gaseous medium that possesses essentially zero reactivity towards the precursors (reactants) and the reaction products. Inert carrier gas 11 is supplied from a separate source or sources (not shown).

It is preferred that precursor fluid 12 is delivered into the reaction chamber 201 in a number of sequential pulses. By way of an example, a widespread in creating microelectromechanical systems (MEMS) ALD process for depositing a coating layer containing aluminum oxide by using trimethylaluminum (first precursor) and water (second precursor) would employ two these chemicals sequentially supplied into the reaction chamber from two sources via the same feedline 21 or two different feedlines. Between the pulses, the reaction chamber is purged by inert fluid.

Manufacturing complex multilayer structures (so called stacks), wherein each layer is produced in a separate ALD cycle and/or wherein said layers differ from one another in terms of composition, may employ three or more different precursors and supply sources, accordingly.

In some instances, a mixture of compounds, such as a predetermined precursor in a solvent, for example, can be supplied from the same precursor source.

Precursor(s) 12X and the inert carrier 11, each supplied from different sources, enter the feedline 21 via a multi-port valve 21A. The valve 21A is configured as a three-port valve, for example, with an automated control system and optionally a manual backup control. In preferred configurations the valve 21A is a three-way valve, commonly known as an ALD-valve. ALD-valves are configured to maintain a steady flow of inert carrier fluid 11 into the reaction chamber and to introduce fluidic precursor(s) 12X into said carrier at predetermined points of time. The ALD-valve can be configured to inject the precursor 12X into the (continuously) flowing carrier. Additionally or alternatively, other control means, such as mass flow controller(s), for example (not shown), can be provided upstream the valve 21A to alter the flow of carrier fluid 11 for a time period the precursor 12X being injected into the feedline 21. In either situation, injection of a precursor is performed in brief pulses (0.01-100 s, typically 0.1 s).

In configurations when the reactor comprises more than one feedline 21, it is preferred that each said feedline is equipped with the ALD valve 21A.

In some configurations, the valve 21A can be a four-way valve with an additional waste line, as described in WO2018/234611 and/or WO2018/202949. Additional valves, such as three- or four-way valves, can be adopted to the feedline 21 or connected directly to the fluid distributing device 100.

The reactor 200 be further equipped with an optionally heated compartment 22 (referred to as a "valve block") containing any one of the valves 21A and 21B, and optionally any one of the precursor source(s) 12X and inert carrier source(s) 11, accordingly. Each precursor source 12X can be further enclosed in a cartridge with individual thermal adjustment; exemplary implementation of such source is described in WO2009/130375.

With reference to FIG. 1, reactive fluid(s) 12 are delivered into the reaction chamber via a number of inlets 103 connected to the at least one feedline 21 and/or directly to the precursor source 12A via the valve 21A. Prior to entering the reaction chamber 201, reactive fluid(s) 12 are received, via the inlets 103, into the fluid distributing device 100, described hereinbelow.

Figure 2:
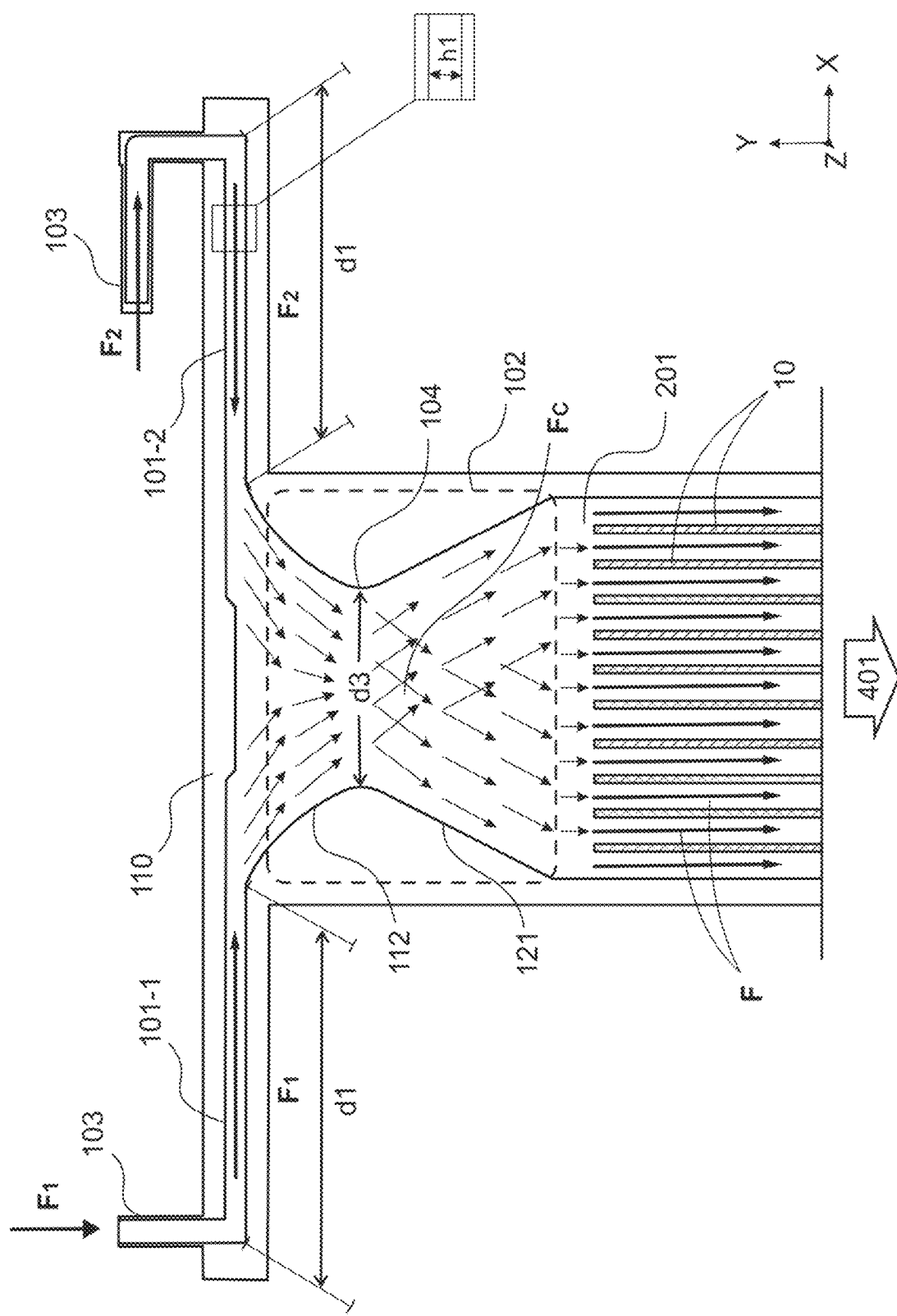
FIG. 2 is a partial cross-sectional view of the deposition reactor 200, according to an embodiment, and of a fluidic flow established therein.
Figure 5A:
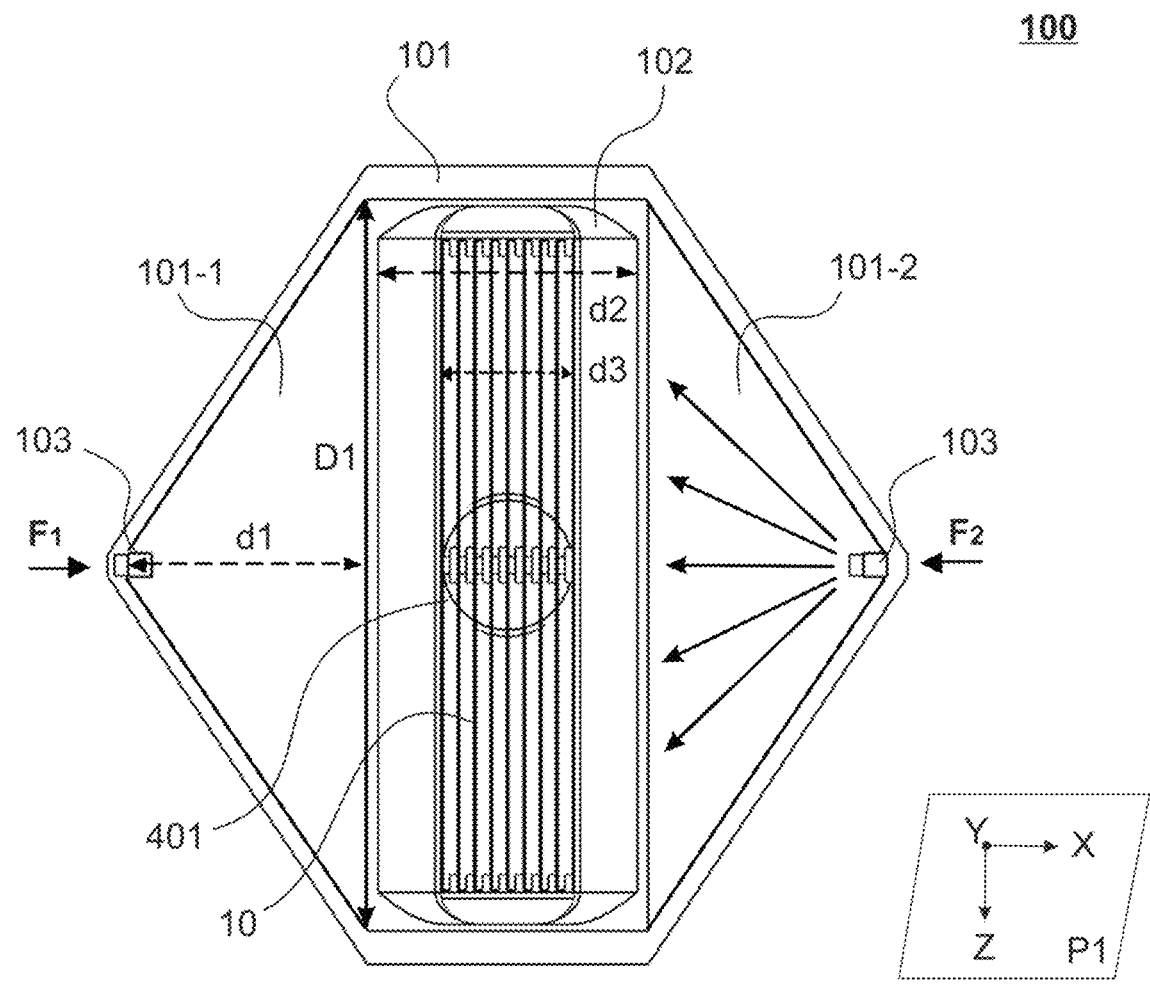
FIG. 5A is a cross-sectional top view of the fluid distributing device 100, according to an embodiment.

Reference is made to FIGS. 2 and 5A illustrating the fluid distributing device 100 as a vertical crosscut viewed from side (FIG. 2) and as a horizontal crosscut viewed from top (FIG. 5A). Orientation of the apparatus 200 on FIG. 2 is the same as on FIG. 1. In three-dimensional Cartesian system of coordinates, FIG. 2 shows a view along a longitudinal cross-sectional plane (an intersection of the fluid distributing device 100/the apparatus 200 with the plane XY), whereas FIG. 5A shows a view along a transverse (horizontal) cross-sectional plane (an intersection of the fluid distributing device 100 with the plane XZ). In the reaction chamber 201, the substrates 10, such as disc-shaped wafers, for example, are arranged (in the substrate holder 202, FIG. 1) into a so called vertical stack, whereupon side surfaces of the substrates 10 face each other (parallel to each other). All substrates are arranged along a longitudinal axis (Y-axis) of the reaction chamber 201/the reactor 200.

The fluid distributing device 100 comprises the expansion region 101 and the transition region 102. The expansion region 101 can be viewed as a "lid" of the reactor, in a sense of being a topmost part of the reactor. The expansion region 101 can be optionally formed by a separate part joined to the reaction chamber by standard techniques, such as welding, for example. Hence, in some instances, the expansion region 101 can be provided as a removable and replaceable compartment. The transition region 102 is formed by a zone between said lid (the expansion region 101) and the reaction chamber 201 optionally comprising a number of appliances for efficient mixing of converging fluid streams.

The expansion region 101 comprises sub-regions (sub-volumes) 101-1, 101-2 separated by the transition region 102 but provided under a common top cover 110. The top cover 110 can be supplied as an integral (inseparable) part of the expansion region 101; or, alternatively, the top cover part 110 can be provided as a separate, detachable part (for facilitating maintenance, for example). Top cover is not shown on FIGS. 5A-5C and on FIGS. 7A-7D.

Each said sub-region 101-1, 101-2 comprises at least one inlet 103. Through the inlets 103 fluid streams F1, F2 are received into the expansion region, in particular, into the respective sub-regions 101-1 and 101-2.

In preferred configurations, each sub-region 101-1, 101-2 is rendered, at a horizontal crosscut, with an essentially triangular shape (FIG. 5A). The sub-regions 101-1, 101-2 can be provided in a shape of an isosceles triangle, for example, with at least one inlet 103 disposed at an angle between the congruent sides and opposite to an entrance to the transition region 102 (defined by a distance D1, FIG. 5A). The distance D1 thus defines a base of the triangle.

Each sub-region 101-1, 101-2 is thus established by a compartment having an interior with a distance thereacross (width) gradually increasing between each inlet 103 and the transition region 102 (a distance indicated as d1) to an expansion width D1 in a direction of fluid flow F1, F2 (FIG. 5A). Due to the essentially triangular shape of the sub-regions 101-1, 101-2 fluids propagate between the inlet 103 and the transition region 102, at the distance d1, to the expansion width D1, in accordance with an essentially outspread (radial) pattern; but within the limits defined by the interior of the compartments 101-1, 101-2.

Provision of the inlet(s) 103 on any one of the sub-regions 101-1, 101-2 is such that fluid streams F1, F2 propagate through the sub-regions 101-1, 101-2 at a distance d1, essentially towards one another (shown by arrows on FIGS. 2, 5A). In some embodiments, the inlet(s) 103 on the sub-region 101-1 is/are arranged opposite to the inlet(s) of the sub-region 101-2, thus allowing the fluid streams F1, F2 to propagate towards one another from opposite directions.

The compartments that form the sub-regions 101-1, 101-2 have internal height h1 (FIG. 2). It is preferred that the height h1 is essentially constant across the interior of the sub-regions. Still, the value h1 can vary within each sub-region 101-1, 101-2 in order to adapt to particular flow conditions, for example; whereby a configuration can be attained with the height h1 increasing or decreasing at the distance (d1) between each inlet towards the transition region.

By virtue of such features, as provision of the sub-regions 101-1, 101-2 as substantially extended ("wing-shaped") compartments having their width gradually increasing to reach the expansion width D1 at the distance d1 between the inlets 103 and the transition region 102, the profile of fluid flow (F1, F2) that propagates through the sub-regions 101-1, 101-2 is laminar.

Laminar flow or streamline flow is defined, in the context of present disclosure, as a flow void of turbulence (without turbulent velocity fluctuations). In laminar flow, fluid layers/streams slide in parallel in an absence of voracity, swirls or currents. For clarity, we note that the present invention should not be confused with any kind of venturi applications neither in terms of structural details nor with regard to functionality. Present invention does not utilize incompressible liquids, but gaseous media in conditions of high vacuum and, in most instances, at elevated temperature.

In the apparatus described herewith, laminar flow is naturally supported for both precursor fluid flow and for inert fluid flow, the latter occurring, in ALD, during purge periods, for example.

FIG. 2 shows two alternative configurations for the inlets 103. The inlet on the left (F1) is configured as a tube essentially perpendicular to the expansion region 101 (disposed on a horizontal plane XZ). Fluid F1 entering the expansion space via said inlet (flow vertically downwards) makes a turn essentially at a right angle (90°), whereupon a fluid stream F1 collides with the opposite wall and further propagates via the compartment 101-1 towards the transition region 102 with gradually decreasing flow resistance. Alternatively, the inlet 103 for receiving the flow F1 can be arranged on a lower part of the compartment constituting the expansion region 101 (not shown), whereupon flow F1 shall be established in an upward direction.

The inlet on the right (FIG. 2) for receiving flow F2 is configured as a tube with two right angle turns. Fluid F2 entering such inlet is forced to change its direction twice. As a result, the inertia of fluid flow is reduced. Still, any other appropriate configuration for the inlet and/or a combination of inlets, and/or for position of the inlet(s) in the apparatus is/are not excluded.

The transition region 102 (a so called "throat" of the apparatus 200) is established between the expansion region 101 and the reaction chamber 201. In the apparatus 200, the transition region 102 is a zone, where the fluid streams F1, F2 arriving from the essentially opposite side converge and mix. In terms of its shape and/or a variety of structural appliances, such as 105, 106, for example (described further below), the transition region 102 is configured to receive and to combine fluid streams F1, F2 arriving thereto via the expansion region 101, whereby a combined fluid stream Fc is formed (FIGS. 2, 3A), which is further directed into the reaction chamber 201.

Figure 5B:
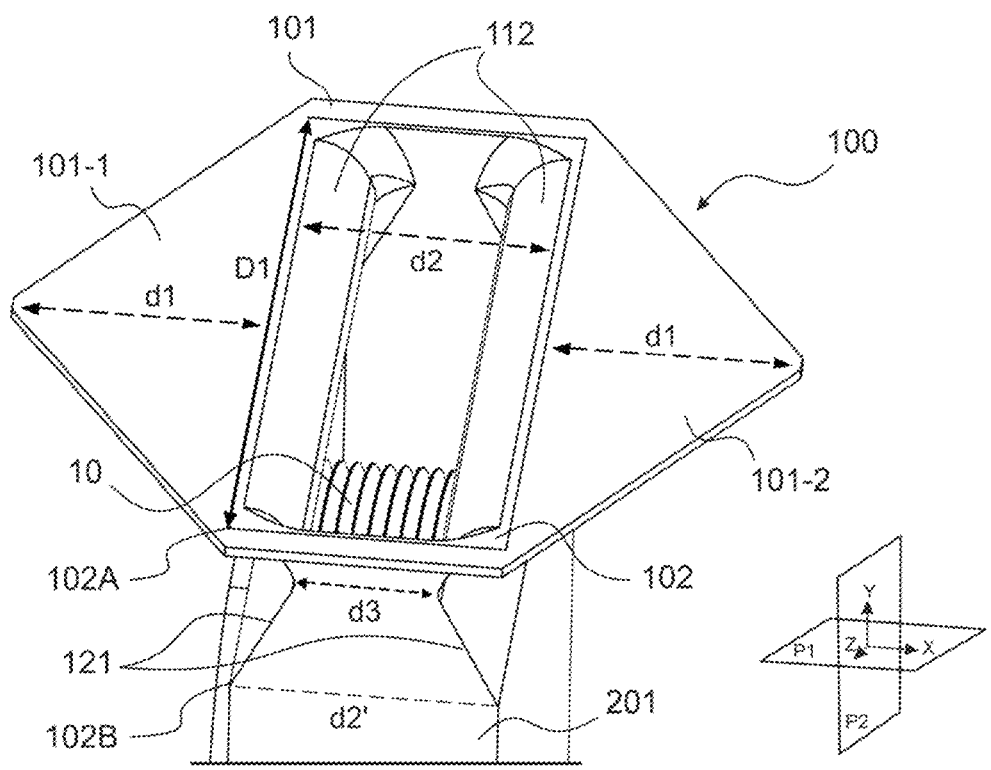
FIGS. 5B and 5C are (partial) perspective views of the deposition reactor with the fluid distributing device 100.

The transition region 102 is established by a channel 102A-102B with an entrance 102A and an exit 102B each provided as an opening having a width d2 and d2' respectively (FIG. 5B). Width parameters d2 and d2' can be equal or differ from one another (d2=d2' or d2<d2' or d2>d2'). Additionally, each opening 102A, 102B has a length extending at the distance D1 that corresponds to the expansion width of each sub-region 101-1, 101-2 (FIG. 5B).

Overall, implementation of the transition region 102 is such as to ensure efficient mixing of the streams F1, F2, whereby precursor chemicals evenly reside on deposited surfaces. Thus, all (wafer) substrates 10 in the reaction chamber become deposited with the uniform layer of precursor so that concentration of precursor is uniform across the individual substrate (side) surface and across the surfaces of all substrates in the batch/in the reaction space. Mixing is implemented, in the transition region 102, in a highly controlled manner, in an absence of vortex formation and without pressure losses, which further enables an efficient purge.

Typically, the cross-sectional area at the opening 102B is defined by the cross-sectional area (XZ) of the reaction chamber, whereas the same at the opening 102A can be a subject to design-related modifications. Hence, the width d2' at the opening 102B typically corresponds to the width of the reaction chamber 201 (FIG. 5B).

The opening 102B thus outlines a boundary between the transition region 102 and the reaction chamber 201; therefore, said opening 102B can be further referred to as an entrance to the reaction chamber.

Figure 5C:
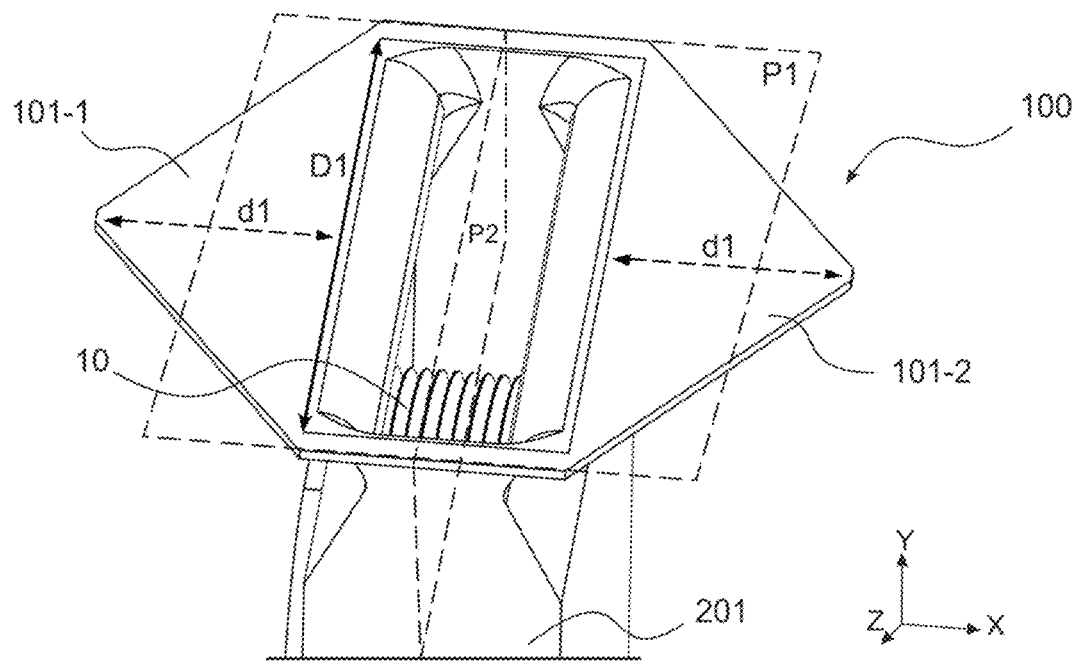

The compartments 101-1, 101-2 forming the expansion region 101 can be viewed as hollow extensions ("wings") provided at a topmost part of the body of the apparatus 200. The sub-regions 101-1, 101-2 extend, at the distances d1, between the opening 102A and the inlet(s) 103. At the distance D1, the opening 102A forms a boundary between the expansion region 101 and the transition region 102 (FIGS. 5A-5C).

In an exemplary layout of the expansion region 101 (FIGS. 5A-5C), a distance between the most remote points of the sub-regions established by the inlets 103, for example (FIG. 5A), exceeds two- or three-fold the distance d2 that defines the width of the channel 102A-102B forming the transition region 102.

In embodiments, the channel 102A-102B has a constant cross-section (intersection with the plane XZ) across its entire height (h2). In such an event, the openings 102A and 102B are identical at their cross-sections. In some configurations, the channel 102A-102B can be configured with varying cross-section (XZ) across its height.

In embodiments, the cross-section (XZ) of the channel 102A-102B, at a distance (h2) between the entrance 102A (with width d2) and the exit 102B (with width d2') is reduced. The width of the channel 102A-102B thus narrows from the value d2 to a predetermined value d3 (FIGS. 2, 3A, 5A, 5B) and further expands to the value d2' at the entrance to the reaction chamber (102B).

The narrowest region of the channel 102A-102B is formed by a constriction zone 104. In some configurations, the transition region 102 thus comprises the constriction zone 104 (FIGS. 2, 3A-3B) with an essentially constant width d3 at the entire distance D1 (FIGS. 5A, 5B).

The constriction zone 104 is preferably formed by inclination of (interior) lateral surfaces 112, 121 (FIGS. 2, 3A) of the channel 102A-102B at the entire distance D1 to the width d3. In said channel, the surfaces 112, 121 are each gradually inclined at a distance from the entrance 102A and the exit 102B, accordingly, towards the constriction zone 104 (FIG. 5B).

Additionally or alternatively, the constriction zone 104 can include (interior) inclinations at the terminal surfaces, i.e. narrow portions provided between the lateral surfaces 112, 121 (not shown).

Figure 3A:
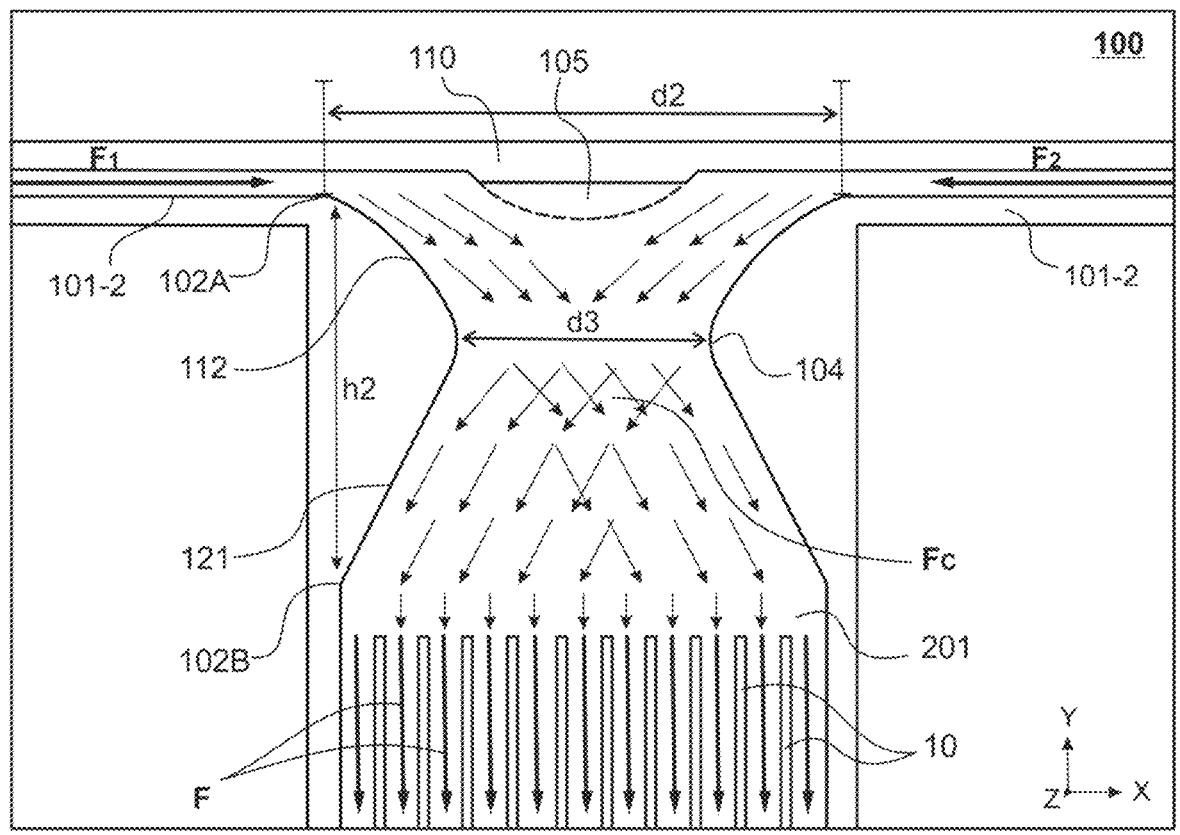
FIGS. 3A and 3B are cross-sectional side views of a fluid distributing device 100, according to various embodiments.
Figure 3B:
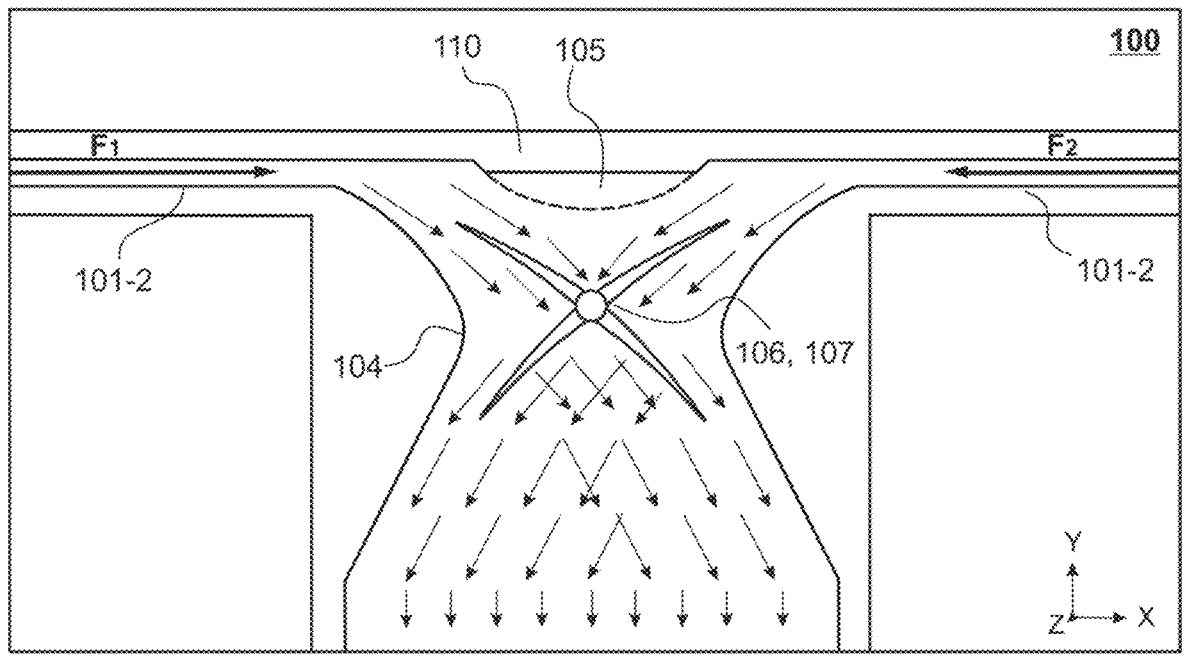

In some configurations, at least a portion of said channel 102A-102B has interior lateral surfaces inclined at a curvature. In some instances, it is advantageous that the portion of the channel is inclined at a curvature at the distance 102A-104 (surface 112), whereas the portion of the channel at the distance 104-102B (surface 121) forms an inclined plane (FIGS. 2, 3A, 3B). Such an arrangement allows for attaining smooth transition of the fluid flow from an essentially horizontal plane (XZ) to an essentially vertical plane (XY), as defined in a direction of fluid flow.

In the transition region 102 the fluid streams F1, F2 arriving into the channel 102A-102B from the essentially opposite directions (101-1, 101-2) converge and combine to form a combined stream Fc. Mixing of inflowing fluids F1, F2 and formation of the combined stream Fc is schematically shown on FIGS. 2, 3A.

FIGS. 3A and 3B illustrate a number of additional appliances 105, 106 provided in the fluid distributing device 100 for promoting mixing of fluids F1, F2.

In some configurations, the device 100 comprises a flow-shaping element 105 configured to adjust a flow direction of the fluid streams F1, F2 entering the transition region 102 such as to direct said streams essentially towards the reaction chamber 201. The flow-shaping element 105 can be provided as an integral extension of the top cover 110 or as a separate part removably connectable to the interior of the said top cover.

At a cross-section, the flow-shaping element 105 can have a shape of a dome (FIGS. 3A, 3B), a triangle, a truncated triangle, and the like. In the fluid distributing device 100 the element 105 is preferably arranged such that its' crest (the most protruding, flow-shaping part) faces the reaction chamber 201. The element 105 can be provided as a continuous element having same cross-section throughout the distance D1; or, alternatively the element 105 can be provided as a number of shaped items (domes, triangles, etc.) sequentially arranged at said distance D1.

The element 105 prevents the streams F1, F2, that arrive into the transition region 102 via the compartments 101-1, 101-2, from colliding at the entrance 102A (FIG. 5B, element 105 not shown); instead, the element 105 guides the streams F1, F2 towards the constriction zone 104. The arrangement improves mixing rate and mixing uniformity.

Additionally or alternatively, the fluid distributing device 100 comprises a mixing arrangement 106 arranged in the transition region 102 (FIG. 3B). In embodiments, the mixing arrangement comprises a shaft or a rod extending at the distance D1 (within the transition region 102) provided with a number of stationary blades disposed on said shaft in a cross-wise manner (FIG. 3B). The blades can be configured, at a cross-section, with curved, sharp-edged profiles. In some other embodiments, the blades or similar tools (rods, bars, fingers, etc.) can be arranged at the interior surfaces forming the transition region 102 or the cover 110. Said tools can be provided also by other methods, by extrusion, for example. Any other appropriate implementation of the mixing arrangement 106 is not excluded.

In the configurations where the fluid distributing device 100 comprises the appliance(s) 105 and/or 106, provision of the constriction region 104 in the channel 102A-102B can be omitted.

In embodiments, a plasma generating arrangement 107 is provided (FIG. 3A). The plasma generating arrangement 107 can replace or complement the mixing arrangement 106. In a latter case, the plasma electrode(s) can be integrated into the structure of the mixing arrangement 106. In terms of design features, said plasma generating arrangement 107 is constructed and/or connected to internal walls of the reactor in similar manner as described for the mixing arrangement 106. The plasma generating arrangement 107 comprises or consists of at least one plasma source, such as plasma electrode, for example. The plasma source is defined, in the context of the present disclosure, as a device that can generate and/or emit plasma from bypassing fluid, preferably, gas. Moreover, the apparatus 200 can include a device or devices for generating plasma disposed outside the reaction chamber, such as the device(s) for generating inductively coupled plasma. Such device(s) preferably include(s) a high frequency induction coil and a high frequency power source (not shown).

In some configurations, the plasma generating arrangement 107 comprises or consists of at least one plasma antenna. Said plasma antenna(s) can be provided in the form of an individual rod extending at the distance D1 (as described for the mixing arrangement 106 hereinabove) or as one or more "fingers" arranged at the interior surfaces forming the transition region 102 or the cover 110.

A combined fluid flow (Fc), comprising the streams F1, F2 mixed in the transition region, is further directed into the reaction chamber 201. Fluid flow established at the entrance 102B (FIG. 3A) to the reaction chamber and propagating through said reaction chamber is indicated on FIGS. 2, 3A as a flow F. The flow F established at the entrance to the reaction chamber and propagating between the substrates 10, through the entire length of said reaction chamber, is laminar.

In the reactor 200, propagation of the fluid streams F1, F2 through the transition region 102 on their way from the expansion region 101 (101-1, 101-2) to the reaction chamber 201 is accompanied by change in direction of said fluid streams. By provision of the fluid distributing device 100 according to the embodiments and by virtue of a relatively flat reaction chamber 201 provided as a confined space that encompasses a batch of substrates arranged into a vertical stack, formation of jets, vortices and/or swirls in the fluid pattern propagating through the transition region 102 is prevented.

The reactor 200 is configured in such way, that flow of fluid through each compartment thereof is maintained laminar Fluid, indicated for clarity purposes as streams F1, F2, Fc, F, travels through each respective compartment 101-1, 101-2, 102, 201 in regular paths, in an absence of fluctuations or irregularities, whereby flow velocity, pressure, acceleration and other flow properties remain essentially constant at any point within each imaginary cross-section of a fluid flow traveling through each particular compartment. Although the abovementioned parameters are maintained essentially constant at a leading edge and within each (imaginary) crosscut across a fluidic pathway in direction of fluid flow, some parameter values (pressure, flow velocity) may decrease at a distance defining an entire fluidic path from the inlets 10 towards the substrates 10 and/or upon propagating through the reaction chamber 201.

The transition region 102 ("a throat") is implemented in such a way as to allow for efficient (convection- and diffusive) mixing of fluids in laminar conditions. In said transition region, fluid streams F1, F2 arriving from essentially opposite directions are redistributed and recombined (Fc) to form the flow F, parallel to a flow direction Y corresponding to the longitudinal axis Y of the deposition apparatus, in an absence of vortices or jets associated with turbulence Laminar mixing in the transition region 102 is attained by a distinctive configuration of the fluid distribution device 100 and the reaction chamber 201.

Streams F1, F2 converge and mix at the transition region 102 having the boundary D1 with the expansion region 101 (FIGS. 5A-5C). The combined stream Fc propagates, in the form of the flow F, into the reaction chamber 201 configured as a substantially flat, elongated body. It is preferred that the reaction chamber 201 has a constant cross-section (plane XZ) throughout its entire length defined by the Y-axis (from its boundary with the transition regions indicated on FIG. 5B by 102B to exhaust).

Flow F established at the entrance to the reaction chamber thus propagates between the side faces of the substrates 10 through the length of said reaction chamber with essentially uniform velocity.

The reactor 200 according to the embodiments allows for uniform deposition of a coating film simultaneously on all substrate surfaces by establishing a laminar flow (F) of the precursor fluid 12 through the length of the entire reaction chamber 201. In conditions of laminar flow, the precursor fluid 12 propagates between the side faces of the substrates 10 with essentially uniform velocity at the leading edge. The apparatus 200 allows for avoiding deposition faults arising from irregular deposition rates on the substrates in the stack (caused by non-uniform and/or turbulent precursor fluid flow between the substrates) and common to conventional chemical deposition reactors.

In the reactor 200, uniform concentration of a precursor (essentially same amount of precursor molecules in a predetermined volume) is attained at the entrance to the reaction chamber (102B, cross-sectional plane XZ). Precursor concentration is maintained essentially uniform when precursor fluid propagates, in the form of steady, laminar flow F, through the entire length of the reaction chamber and between the substrate 10. Hence, all faces of the substrates 10 become deposited with a film having same thickness and uniform/even distribution of precursor molecules across the deposited surface(s).

Arranging the substrates in the reaction chamber side-by-side and closely adjacent to each other (nevertheless leaving a gap in between) contributes to establishing the laminar flow between said substrates 10. In practice, the reaction chamber can be provided in different sizes to dimensionally conform, in a non-limiting manner, to a variety of standard substrates, such as disc-shaped wafer substrates having a diameter ranging within 25-300 mm. The reaction chamber 201 (and the entire reactor installation 200, accordingly) can be further modified to incorporate the substrates, whose diameter exceeds 300 mm.

Figure 6A:
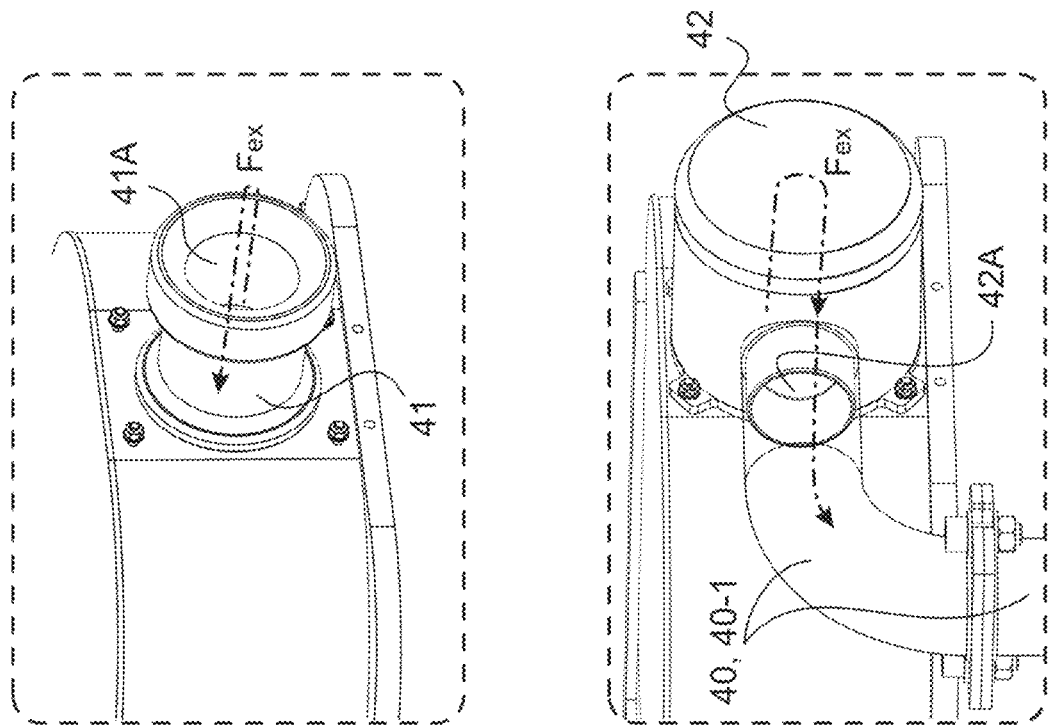
FIG. 6A is a perspective view of the deposition reactor 200 with an exhaust arrangement according to an embodiment.
Figure 6A:
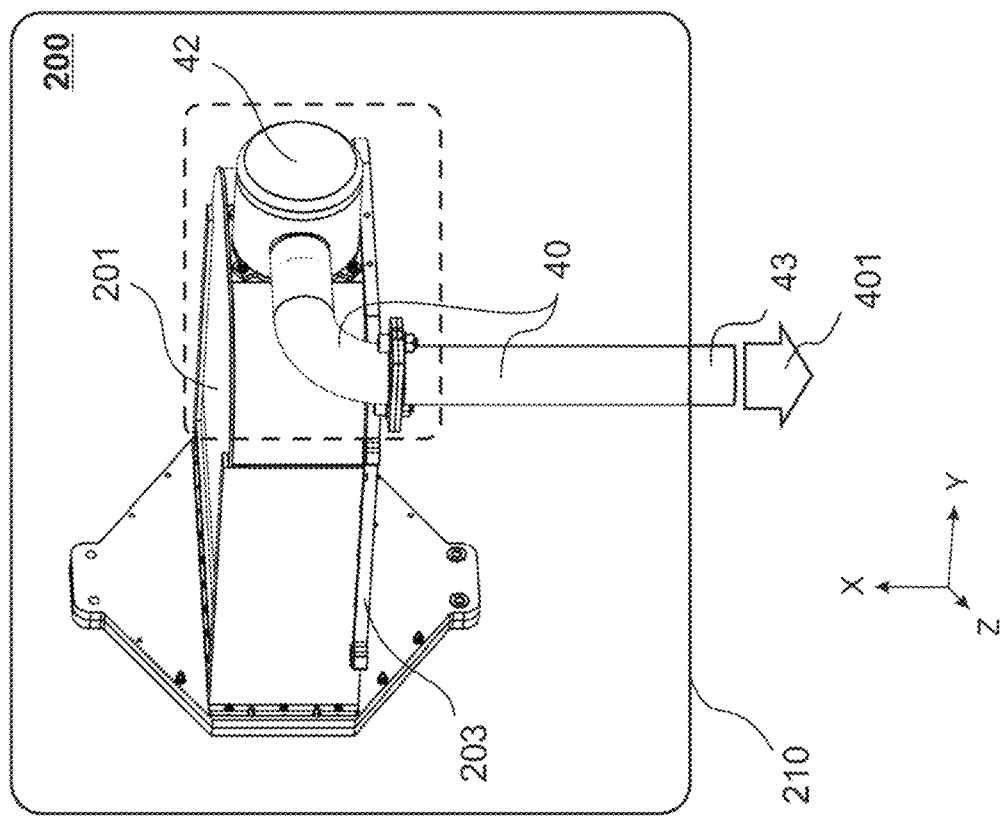

In the event the disc-shaped substrates 10 are utilized, an exhaust end of the reactor 200/the reaction chamber 201 can be curved or arched (FIG. 6A).

In order to prevent precursor chemicals from mixing in the fluid distributing device 100 prior these chemicals shall reach the transition region 102 and to maintain a steady flow at a uniform flow rate via the reactor 200, the following arrangements can be made.

While the delivery of a precursor chemical to one side of the reaction chamber (via a first sub-region 101-1, for example), said chemical is pulsed (injected) into a flow of inert fluid continuously flowing via the feedline(s) 21 into the deposition reactor via the three- or four-way valve. At the same time, there is a constant flow of inert fluid 11 from the other direction (via a second sub-region 101-2, for example). In ideal conditions, pressure in the feedlines at both sides (101-1, 101-2) is maintained essentially the same (e.g. 5 mbar). However, pressure in the feedline changes at a moment when the precursor chemical is injected, from the precursor source, to said feedline 21, due to higher pressure normally maintained in the container containing the precursor chemical (10 mbar, for example). This can be compensated by a number of methods, such as:

- rapid flow alteration in the precursor injection feedline, with a mass-flow controller or another appropriate regulating device;
- pressure compensation in the precursor injection feedline by increasing the flow rate in the feedline on another side (inert fluid supply) to match the increased pressure in the precursor injection feedline; and,
- rapid pressure change (increase or decrease) in the precursor injection feedline, with additional valves parallel to the mass-flow controllers.

Figure 4A:
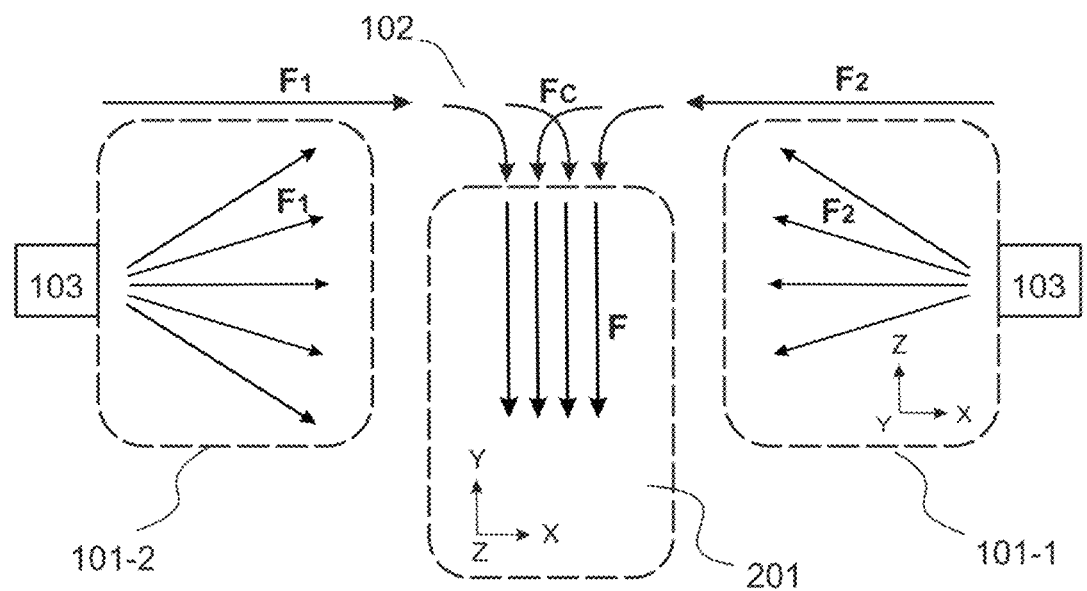
FIG. 4A schematically illustrates propagation of fluids through the deposition reactor, according to an embodiment.
Figure 4B:
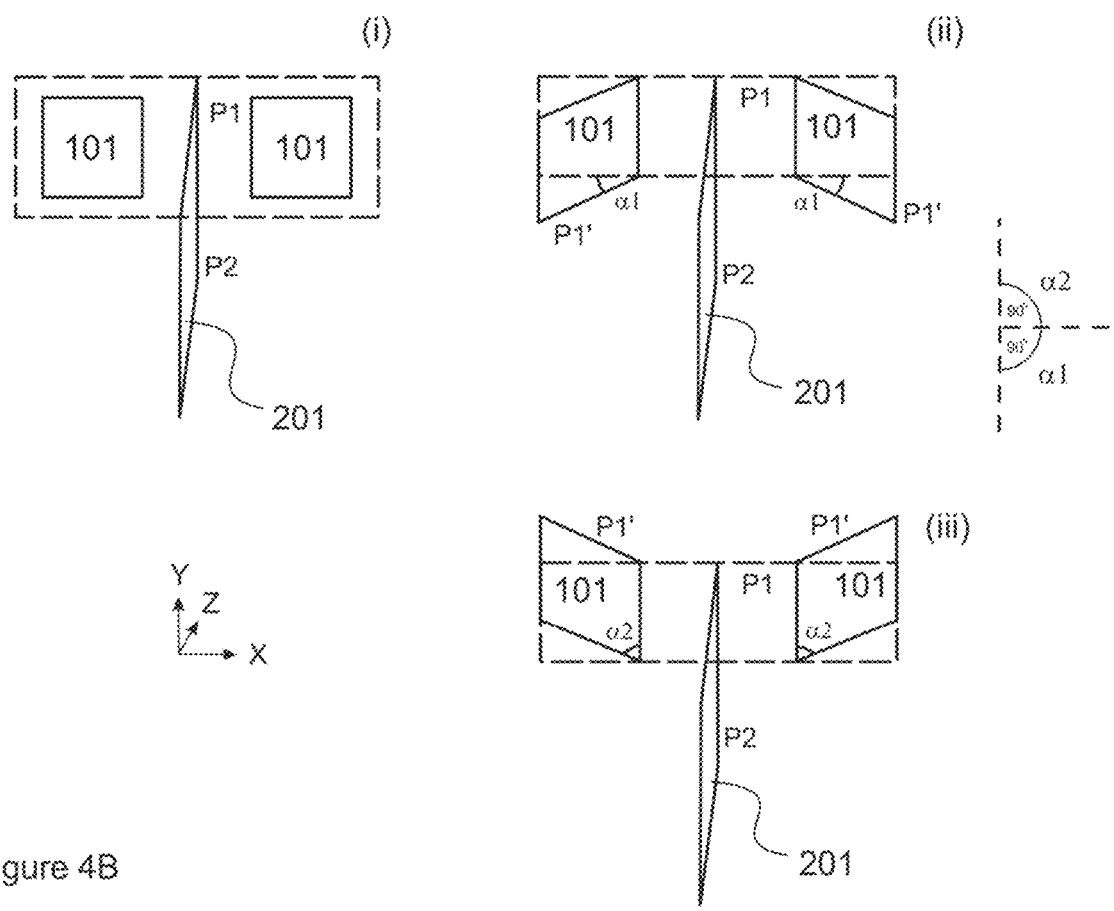
FIG. 4B schematically illustrates organization of various parts within the deposition reactor in cross-sectional planes.

Reference is made to FIGS. 4A and 4B, wherein FIG. 4A aims at providing a skilled reader with an insight on three-dimensional fluid propagation in the reactor 200 and FIG. 4B shows various configurations for the expansion volume(s) 101. A reference frame is specified by a three-dimensional Cartesian system of coordinates.

Schematics of FIG. 4A combines a horizontal cross-cut view of the fluid distributing device 100 (viewed from top as shown on FIG. 5A) and a vertical cross-cut view of the reaction chamber 201 (viewed from side as shown on any one of FIG. 1, 2, 3A or 3B).

FIG. 4A shows the reaction chamber 201 as an intersection with a longitudinal cross-sectional plane (XY) along the longitudinal axis (Y-axis) of the deposition apparatus 200. The sub-regions 101-1, 101-2 forming the expansion region 101 are shown as intersections with a horizontal cross-sectional plane (XZ) essentially orthogonal to the longitudinal axis Y of said deposition apparatus. The cross-sectional plane XZ is indicated on FIG. 4B by a reference mark P1. Said cross-sectional plane P1 is further regarded as a plane on which the sub-regions 101-1, 101-2 are disposed.

FIG. 4B further shows orientation of an essentially flat, elongated vessel forming the reaction chamber 201 with regard to the plane 1 (P1). The reaction chamber 201 is thus shown on FIG. 4B as an intersection with a longitudinal cross-sectional plane (YZ) along the longitudinal axis (Y-axis) of the deposition apparatus 200.

The cross-sectional plane (YZ) forms a plane of symmetry for the sub-regions 101-1, 101-2 along the longitudinal axis (Y-axis) of the deposition apparatus 200. Apart from some insignificant details (e.g. configuration of the inlets 103), the plane YZ bisects the apparatus 200 into halves, which are mirror images of each other and each such half comprises the sub-region 101-1, 101-2.

The plane of symmetry for the sub-regions 101-1, 101-2 along the longitudinal axis of the deposition apparatus 200 is indicated on FIG. 4B by a reference mark P2.

Configuration (i) shown on FIG. 4B corresponds to the embodiments shown on FIGS. 5A-5C. In the reactor according to configuration (i), the fluid distributing device 100 is configured such that the direction of fluid streams F1, F2 propagating through the expansion region 101 (101-1, 101-2) is essentially perpendicular to the direction of fluid flow F propagating through the reaction chamber 201.

In configuration (i), the horizontal plane P1 is thus perpendicular to the vertical plane P2.

At (i) and (iii), FIG. 4B shows alternative configurations for the reactor 200, in where the compartments 101-1, 101-2 do not lay on the plane P1, but instead each compartment is inclined from said plane P1 by a predetermined angle α (alpha). Inclination plane for each compartment/sub-region 101-1, 101-2 is defined by a reference mark P1' (FIG. 4B, ii, iii).

Thus, in configurations (ii, iii), the sub-regions 101-1, 101-2 are each disposed at cross-sectional planes P1', each such plane P1' being inclined by the predetermined angle with regard to the cross-sectional plane (P1). For clarity, FIG. 4B shows the plane P1 as a dashed box, whereas the inclined planes P1' have a solid outline.

The inclination angle (alpha) can be provided within a range of 0-180 degrees or more preferably 5-45 (95-135) degrees from the XZ-plane. On FIG. 4B, the right angle α1 (alpha 1) and the right angle α2 (alpha 2) together define the range of 0-180 degrees. To put the configurations (ii, iii) into practice, an inclination border for each sub-region should lie along the boundary D1 at each side of the transition region 102, as described hereinabove.

It is further preferred that the inclined planes P1' are mirror-symmetrical.

In all configurations described above, the fluid distributing device 100 is configured such that at the transition region 102 each fluid stream F1, F2 makes a turn from the cross-sectional plane P1, P1' (expansion region 101) to a cross-sectional plane P2 (reaction chamber 201), while maintaining laminar flow in all mentioned compartments 101, 102, 201. The plane P2 (YZ) is further defined as a plane of symmetry for the sub-regions 101-1, 101-2 along the longitudinal axis (Y-axis) of the deposition apparatus 200.

Planes P1, P2 are further indicated on FIGS. 5B, 5C.

In configurations described above, the substrates 10 are placed such that their side surfaces align with said plane P2 (YZ). Hence, in a batch of substrates arranged into a vertical stack and placed into the reaction chamber, all substrates are parallel to said plane P2.

Figure 6B:
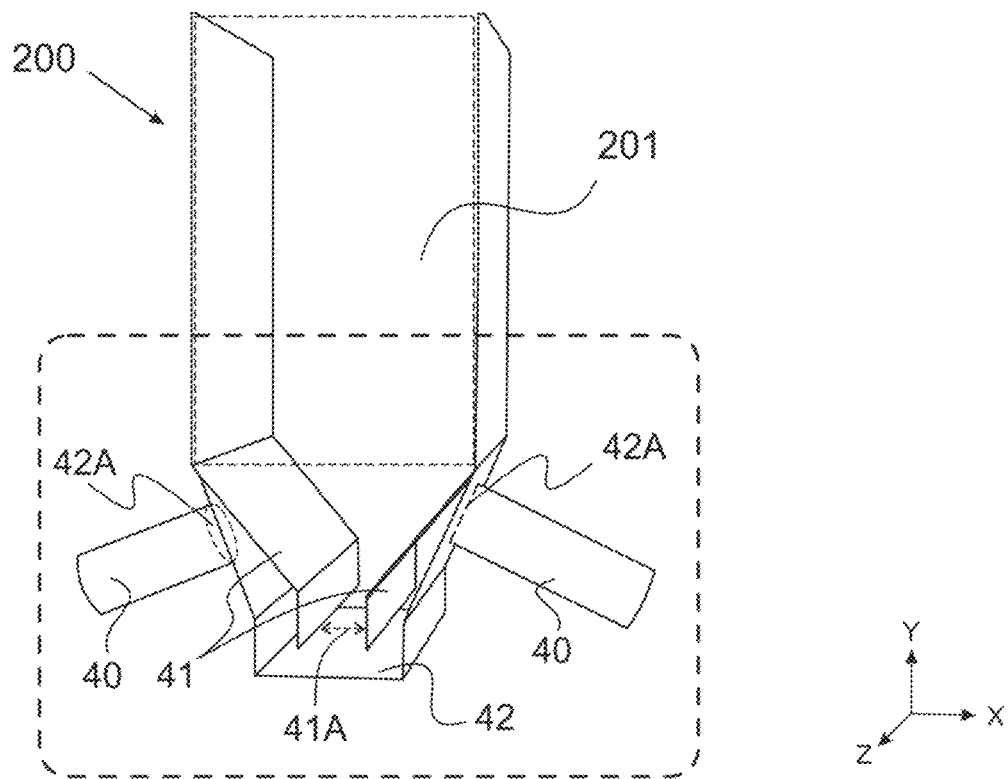
FIG. 6B is a schematic view of the deposition reactor 200 with the exhaust arrangement according another embodiment.
Figure 6B:
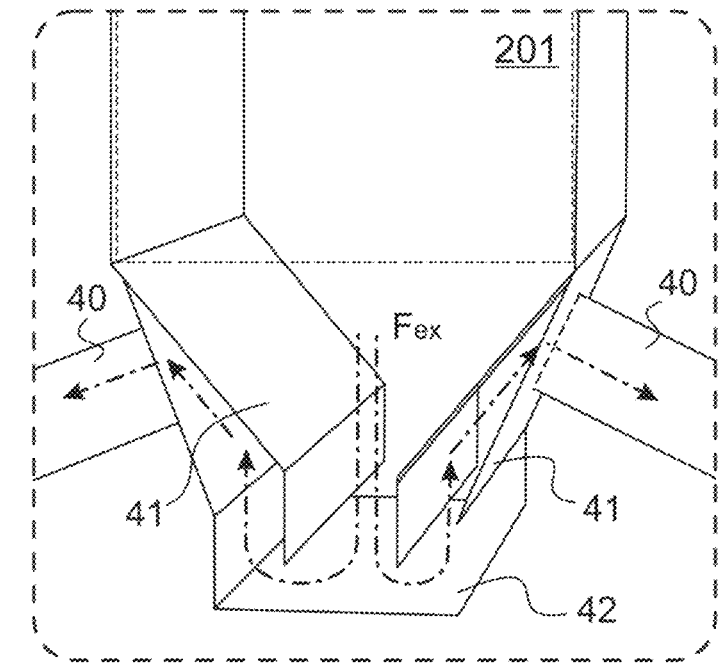

FIGS. 6A and 6B illustrates embodiments, in which the reactor 200 further comprises an exhaust assembly arranged to alter a direction of exhaust flow exiting the reaction chamber 201. The exhaust assembly is formed by an exhaust conduit 41 and an enclosure 42 configured to accommodate the conduit 41. The exhaust assembly is connectable to an exhaust manifold 40 configured as at least one tube with or without a bend. The bend can be a J-bend, for example. By the manifold 40, the reactor is further connectable to the vacuum pump fore-line 401 via a feedthrough arrangement 43 (the vacuum pump is not shown). Arrangement of the manifold tube(s) 40 with regard to the reactor 200 shown on FIGS. 6A, 6B is exemplary and may vary dependent on specific implementation.

The exhaust assembly 41, 42 advantageously replaces a common solid exhaust tube with a bend (e.g. J-bend) attached directly to the reaction chamber (not shown).

On FIG. 6A, the upper dashed box shows the exhaust end of the reactor 200/the reaction chamber 201 without the manifold 40. At the exhaust end the reactor is provided with the exhaust conduit 41 with an exit aperture 41A. The exhaust enclosure 42 configured as a "cup" having a larger diameter than that of the exhaust conduit 41 is arranged around said conduit. In configuration of FIG. 6A, the cup-shaped enclosure 42 is mounted onto the conduit 41. The enclosure 42 has an aperture 42A, optionally configured as an orifice or an orifice pipe, located on a side wall thereof. The enclosure 42 mediates connection between the manifold 40 and the reaction chamber 201 (lower dashed box). Solid bottom of the enclosure 42 forms a "dead-end" for the exhaust flow (Fex) exiting the reaction chamber and forces the exhaust flow into the manifold 40 via the aperture/the orifice 42A disposed on the side wall of said enclosure. Flow evacuated from the reaction chamber 201 (exhaust flow, Fex) via the exhaust conduit 41 (FIG. 6A, upper dashed box) comes against the solid bottom of the enclosure 42 (the exhaust cup 42, FIG. 6A), wherefrom said exhaust flow is forced to make a turn inside the enclosure 42. The elements 41, 42 are configured such, as to support exhaust flow turning at a predetermined angle, preferably the angle of least 90 degrees. In configuration shown on FIG. 6A, the exhaust flow turn is about 180-degrees into an essentially opposite direction said flow has arrived from, i.e. into a direction of the reaction chamber (FIG. 6A, upper and lower dashed boxes). The 180-degree turn occurs inside the enclosure 42. Thus, the exhaust flow Fex turns around the exhaust conduit 41 (makes a "U-turn") and exits the enclosure 42, via the aperture(s)/the orifice(s) 42A, into at least one manifold tube 40. In said manifold tube(s) 40, flow direction can be essentially perpendicular to that in/through the exhaust conduit 41. For clarity, graphical representation of the cup 42 from the upper dashed box is omitted (FIG. 6A).

FIG. 6B shows an alternative embodiment for the exhaust assembly 41, 42. Herein, the exhaust conduit 41 is established by inclination of a bottom surface of the reaction chamber 201, across the entire width of the reaction chamber (Z-axis), to form a gradually narrowing channel with an elongated exit aperture or a gap 41A (plane XZ). Mentioned channel is enclosed into the elongated enclosure space 42 adapted to fit the shape of the reaction chamber 201 at its bottom part. The embodiment can be viewed as the reaction chamber 201 with a "double" bottom, in where the turn, such as the U-turn, for example, is formed by an intermediate wall established by the conduit 41 within the enclosure 42. In present configuration, exhaust flow (Fex) makes the turn at the predetermined angle, such as at least 90-degree turn, over an edge of the entire reaction chamber in the enclosure 42. In some configurations, said turn is about 180-degree turn.

Exhaust flow making the U-turn can be at least partly restricted to the XY-plane with a number of flow guides, for example. In such a manner, exhaust uniformity over the width of the reaction chamber in Z-direction can be improved. In order to further optimize flow parameters, dimensions of the components forming the vacuum pump fore-line, such as the feedthrough arrangement 43, for example (FIG. 6A), can be adjusted.

FIG. 6B thus shows the configuration with the exhaust manifold 40 comprising two tubes positioned on the opposite sides of the reactor 200/the reaction chamber 201. Depending on a specific design and its optimizations, provision of the manifold comprising one tube or any other number of tubes is possible.

The aperture/the orifice 42A can be connected to the corresponding manifold tube 40 by means of a flange or a collar. In such an event it is preferred that an exit aperture of the orifice 42A facing the manifold tube 40 has essentially same diameter as said manifold tube. In some alternative configurations, the orifice 42A can be configured to fit inside the manifold tube 40 whereby a slide connection can be created (lower dashed box, FIG. 6A). In both configurations described, the connection between the cup 42 and the manifold 40 can be further secured by welding, for example.

The advantage of the exhaust assembly with the flow turn described above is a compact design without compromising on flow conditions. The exhaust conduit 41 and the enclosure 42 together form a passage, in which exhaust flow (Fex) exiting the reaction chamber 201 via the exhaust conduit 41 makes a turn, such as an about 180-degree turn, around a wall forming said conduit 41, while remaining in the enclosure 42. From the enclosure 42, via the aperture 42A arranged on at least one side wall thereof, exhaust flow is further directed into an exhaust manifold 40. The exhaust flow makes said 180-degree turn practically without pressure losses (as it commonly occurs in conventional exhaust tubes with an about 90-degree bend having a centerline radius equal or less than dimeter of said tube, a so called "short radius elbow"). As compared to known solutions, such as said short radius elbow solutions, the exhaust assembly 41, 42 allows for reducing the total length of the reactor 200.

Figure 7A:
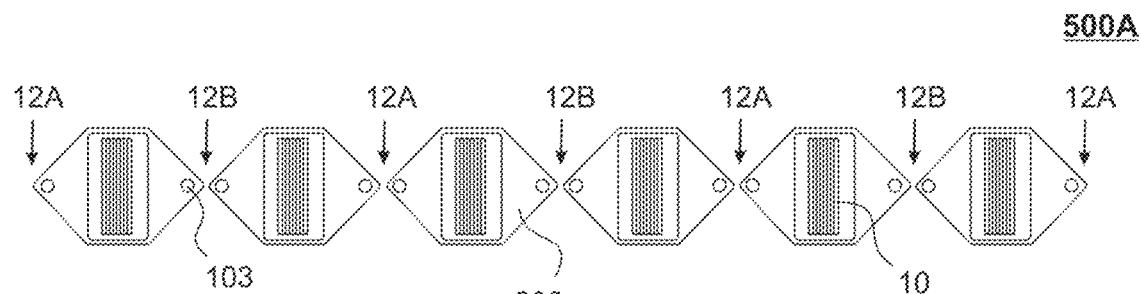
FIGS. 7A-7D schematically illustrates various embodiments for a thin-film deposition system 500, as viewed from the top.
Figure 7B:
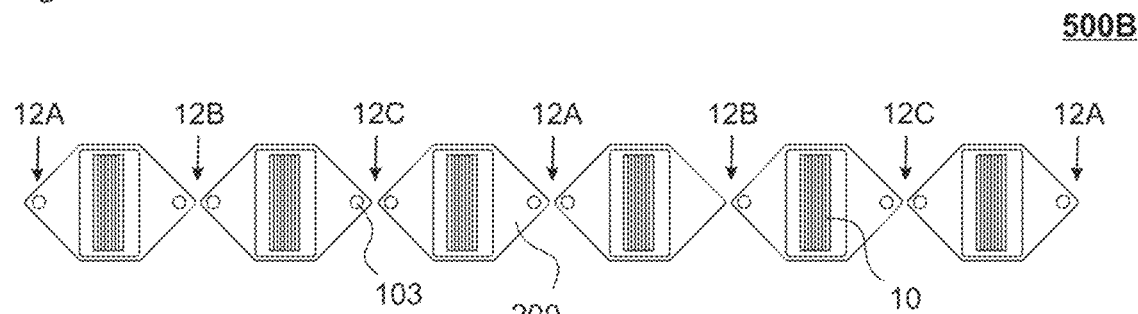
Figure 7C:
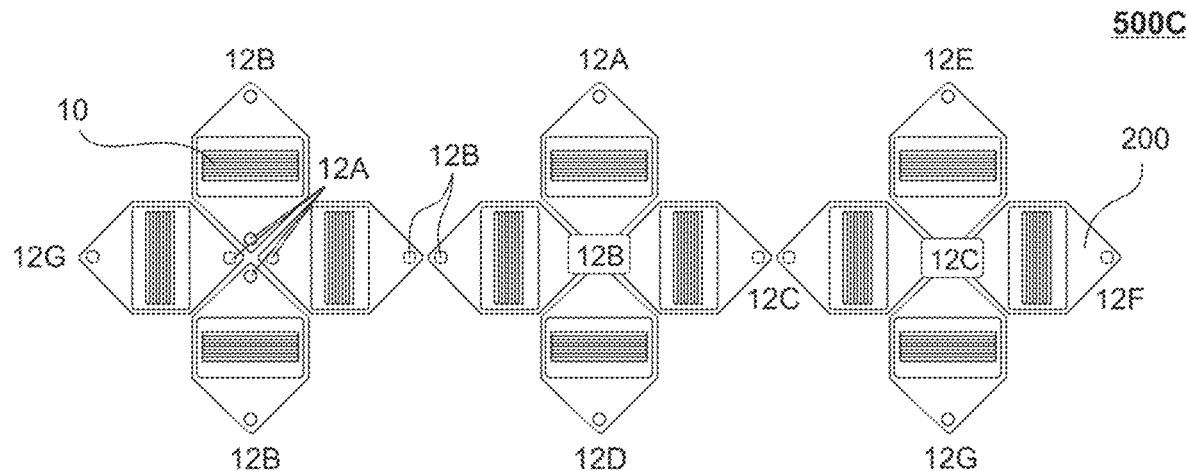

Reference is made to FIGS. 7A-7D illustrating various embodiments of a thin-film deposition system 500. The system 500 is a modular system comprising a number of deposition apparatuses 200, as described hereinabove, connected in sequence and/or in array(s). Sequential connection (connection in-series) is illustrated by FIGS. 7A and 7B (500A, 500B) that show a number of reactor units 200 arranged sequentially to form a line. Array connection (connection "in parallel") is illustrated by FIG. 7C (500C). Each reactor unit 200 thus constitutes an individual module in the system.

Figure 7D:
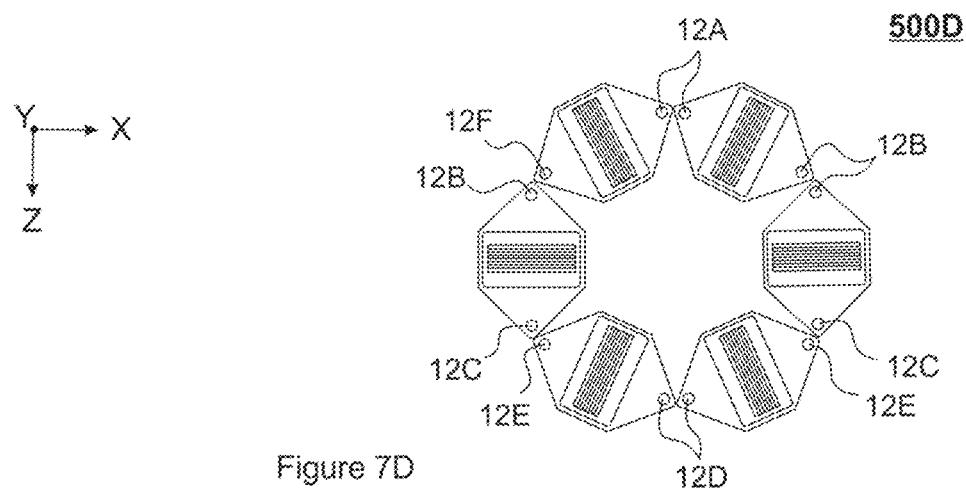

It is preferred that the system 500 further comprises at least one substrate handler (not shown) for loading the substrates 10 into the substrate holder 202 and/or into the reaction chamber 201, unloading the substrates and optionally transporting the substrates between the reactor units 200. Connection between the reactor units 200 in the system 500 is established by fluidic infeed lines 21 and/or manifolds that supply precursor fluids into the individual deposition reactors. It is preferred that the reactor units 200 are arranged such that a predetermined precursor compound provided as any one of 12A, 12B, 12C, 12D, 12E, 12G and 12F is directed from a precursor source into at least two reactor units, optionally being adjacent to one another. In embodiments, the precursor source is a common precursor source that supplies the same precursor (the common precursor) into at least two reactor units. In embodiments, at each contact point between the adjacent reactor units 200 a common precursor chemical is diverted, via a feedline manifold, to each reactor unit. The contact point between the reactor units 200 can be viewed as a number of inlets 103 provided in different reactors units, but disposed adjacent to each other. The contact point is established between at least two reactor units (FIGS. 7A, 7B, 7D). The arrangement having four reactors at each contact point is shown on FIG. 7C. Precursor(s) can be supplied into said at least two reactor units simultaneously or sequentially. In embodiments, supply of a specific precursor chemical, such as 12A, for example, into the reactor units 200 at predetermined contact points is synchronized so that in the system 500, a particular set of valves 21A is actuated to simultaneously supply said precursor chemical 12A, from a related precursor source or sources, into the reactor units at all said predetermined contact points, according to a particular reaction design. By way of example, in configuration shown on FIG. 7B, the contact point between first and second reactor units and the contact point between fourth and fifth reactor units (numbering from left to right) receive an exemplary precursor chemical 12B. In embodiments, the system 500B is synchronized so that the precursor 12B is simultaneously delivered into the inlets 103 of the reactor units 200 forming said contact points. Synchronization is advantageously performed via a control system described further below.

It may be feasible to connect a common precursor source to 2-10 modules; in an event of building the arrays comprising more than 10 modules, it may be preferred utilizing a number of common precursor sources.

In the system 500, the reactor units 200 are further arranged such that each deposition reactor is supplied with at least two different precursors via the inlets 103.

A combination of sequential and array connections can be established by arranging the modules provided in the systems 500A and/or 500B, for example, into a number of rows and connecting the modules such, as to form an array. The reactor units 200 can be further arranged into a ring-like arrangement to form a system 500D (FIG. 7D). A number of units 200 in the ring and the shape of the ring, accordingly (e.g. hexagonal, as shown on FIG. 7D) can be adjusted for a particular deposition system.

The system 500A (FIG. 7A) utilizes two precursors, 12A and 12B. By way of example, whether the precursor 12A is trimethylaluminum (TMA) and 12B is water, effective deposition of aluminum oxide (12A+12B) can be implemented in a number of modules 200 simultaneously. Purging by inert fluids can be implemented via the above described three- and four-way valves 21A (e.g. ALD-valves) in conjunction with the intake line(s) 21 or intake manifold(s).

The systems 500B, 500C and 500D (FIGS. 7B, 7C and 7D) allow for simultaneous operation of a plurality of reactor units 200, whereupon the individual deposition reactors in a sequence (500B) or in an array (500C, 500D) can be configured for depositing the substrates 10 with distinct coatings. By way of example, the system 500B is configured to deposit the substrates with the following coatings: 12A+12B, 12B+12C and 12A+12C.

As a remark, all substrates 10 in a batch loaded into the reaction chamber of an individual reactor unit 200 (a module) are deposited with identical coating. Thus, provision of distinct coatings is adjusted module-wise.

The system 500C comprises a number of arrays, each array comprising four interconnected reactor units 200. All units in the array are supplied with at least one common precursor (12A, 12B, 12C, a source in the middle of each array). By way of example, the common precursor is a first precursor. In practice, the common precursor can be provided as a first precursor, a second precursor or as any other subsequent precursor. Additionally, each reactor unit 200 in the array is supplied with another precursor (e.g. a second precursor) distinct from the first precursor to initiate a chemical deposition reaction. Whether the system embodied as 500C contains more than one row of arrays, arranged in a honeycomb-like arrangement, for example (not shown), both the first- and the second precursors can be considered as "common" precursors with regard to different reactor units 200 in the honeycomb arrangement.

By way of example, the system 500 can comprise a number of reactor units 200 for deposition of metal oxides and a number of reactor units for deposition of metals and/or metal nitrides. The system may further comprise a substrate loader (not shown) for loading substrates into the substrate holder or into the reaction chamber, unloading the substrates and optionally transporting the substrates between the deposition reactors.

It should be noted that configurations shown on FIGS. 7A-7D should not be considered as limiting, but to rather provide guidance to a skilled person to implement the system 500 in any appropriate configuration based on given examples. In similar manner, any suitable combinations of precursors can be utilized.

Figure 8:
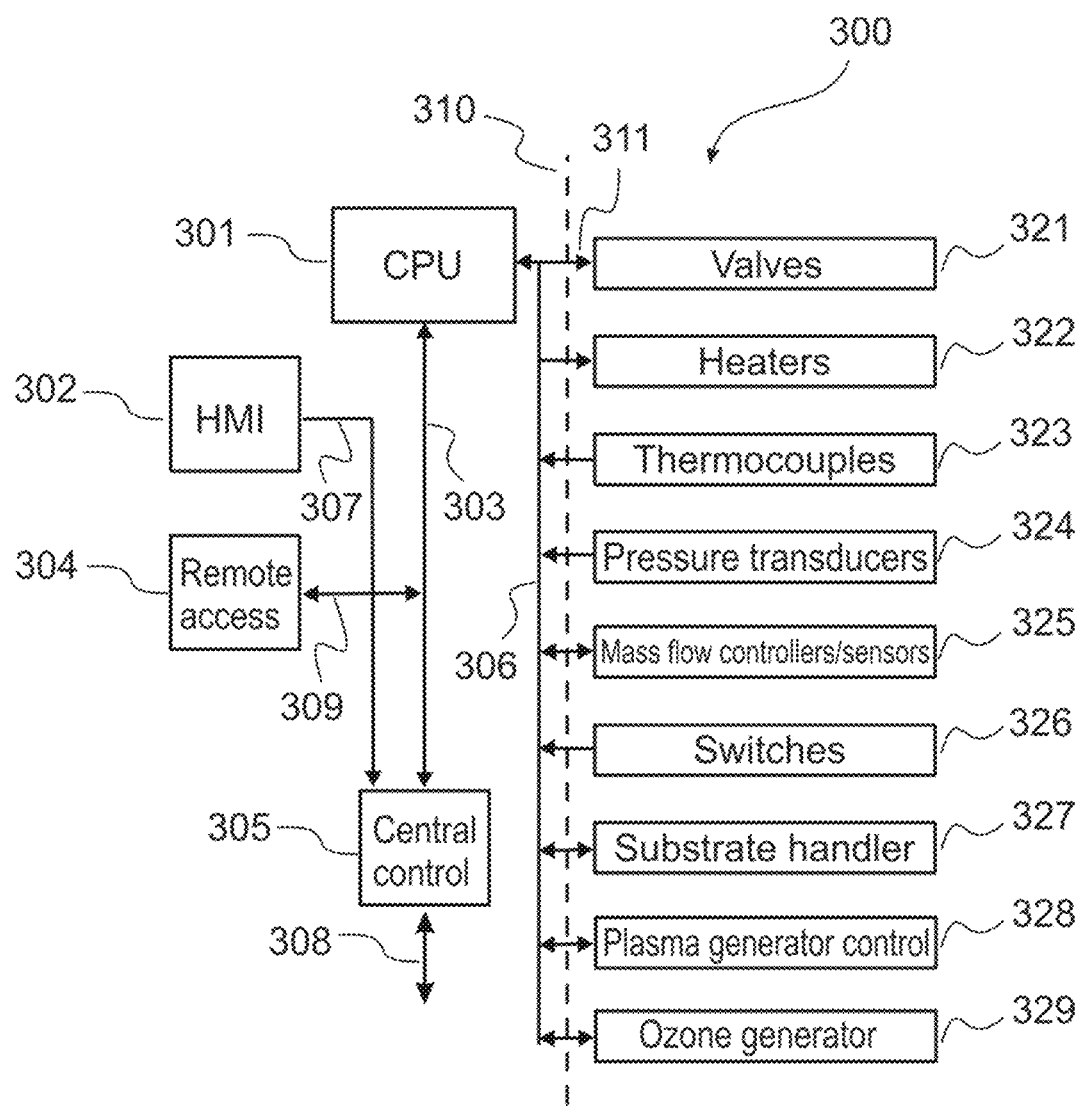
FIG. 8 is a block diagram of a control system of the deposition reactor 200, according to an embodiment.

FIG. 8 is a block diagram illustrative of a control system 300 for the apparatus 200 and/or the system 500. The system 300 comprises at least one processing unit (CPU, 301) in communication with a central control space 305 configured for supervising a number of reactor units 200 in the system 500. Said central control space 305 and optionally the processing unit 301 is/are set into communication with a human machine interface (HMI) 302 and associated software. In a basic system setup process parameters are programmed with the aid of software and instructions are executed with the HMI terminal 302 and communicated, via a line 307, directly or remotely, to the central control space 305 and, optionally (not shown), into the processing unit 301. Any one of the units 301, 305 comprises at least one microprocessor for executing a program code stored in a memory, dynamic and static random access memory, I/O modules, A/D and D/A converters and power relays.

The processing unit 301 transmits and/or receives signals to and/or from valve controllers 321 (that regulate operation of the valves 21A, 21B), sends signals to heater controllers 322 (that regulate operation of the heaters 204 and/or precursor source cartridge heaters), reads output values of thermocouples 323, pressure transducers 324 and switches 326 (e.g. an overheating switch) and has a two-way communication with mass flow controllers and/or sensors 325, a substrate loader 327, control means 328 for a plasma generating arrangement 107, as well as with an ozone generator 320 and associated control means. Signal transmission path between the aforementioned devices 321-327 and the processing unit 301 is schematically indicated on FIG. 8 by a reference numeral 306. A dashed line 310 indicates an interface line between the processing unit 301 and the parts of the deposition reactor 200. Arrows (marked by reference numeral 311) indicate communication lines (one-way or two-way) between the processing unit 301 and the modules 321-329; directions of the arrows are exemplary and may change dependent on configuration.

In an embodiment, program codes of the HMI terminal 302 and the processing unit 301 are updated from a secured remote access point 304 via wired or wireless communication lines 303, 309.

Within the control system 300, the central control space 305 is further provided for supervising a number of reactor units 200 in the system 500 and optionally substrate handle(s), via wired or wireless communication lines 308. In the system 500, the modules 200 can be connected to the central control space 305 in a manner to enable synchronized delivery of precursor chemicals into a variety of adjacent reactor units (at the contact points, as described hereinabove) and integration of various deposition processes, such as the ALD processes, to an automated wafer processing line.

The control system 300 can be provided as an integrated or a standalone CPU solution with a user interface and associated software. Software management functions for the processing unit 301 and/or the central control unit 305 may further include implementing local and/or remote control(s), monitoring a number of deposition reactor modules, emergency power control(s) and the like.

The invention further concerns a method for depositing material on substrate surfaces in a thin deposition apparatus. The method advantageously exploits the apparatus 200 with the fluid distributing device 100 according to the embodiments described hereinabove.

In an embodiment, the method comprises:
obtaining the thin-film deposition apparatus 200 that comprises the reaction chamber for accommodating substrates 10 arranged with their side faces adjacent to each other; and the fluid distributing device 100 that comprises the expansion region 101 comprising sub-regions 101-1, 101-2 and the transition region 102;

establishing a flow of fluid F1, F2 into the sub-regions 101-1, 101-2 via at least one inlet 103 arranged on each sub-region such that fluid streams F1, F2 propagate through the sub-regions in directions essentially towards one another, wherein at least one fluid stream F1, F2 comprises at least one precursor 12X, 12A, 12B, 12C, 12D, 12E, 12F, 12G;

combining fluid streams F1, F2 in the transition region 102, whereby a precursor fluid is formed comprising said at least one precursor, and further directing said precursor fluid into the reaction chamber 201; and depositing material on substrate surfaces by establishing a laminar flow F of precursor fluid at an entrance to the reaction chamber and maintaining said laminar flow upon propagating said precursor fluid between the side faces of the substrates 10 through the length of said reaction chamber.

In said method, the precursor fluid propagates between the substrates 10 with essentially uniform velocity at a leading edge.

The invention further concerns a method for uniform distribution of fluids in an apparatus for thin-film deposition. The method advantageously exploits the apparatus 200 with the fluid distributing device 100 according to the embodiments described hereinabove.

In an embodiment, the method comprises:

obtaining the thin-film deposition apparatus 200 that comprises the reaction chamber 201 for accommodating substrates 10 arranged with their side faces adjacent to each other; and the fluid distributing device 100 that comprises the expansion region 101 with sub-regions 101-1, 101-2 and the transition region 102;

establishing a flow of fluid F1, F2 into the sub-regions 101-1, 101-2 via at least one inlet 103 arranged on each sub-region such that fluid streams F1, F2 propagate through the sub-regions in directions essentially towards one another;

combining fluid streams F1, F2 in the transition region 102, and directing a combined fluid stream into the reaction chamber 201 such that a flow F established at an entrance to the reaction chamber and propagating through the length of said reaction chamber, between the side faces of the substrates 10, is laminar.

Additionally, the invention concerns use of the thin-film deposition apparatus 200 according to the embodiments for depositing thin films of coating material on substrate surfaces. In embodiments, the apparatus 200 is utilized in chemical deposition methods, in particular, in the methods of Atomic Layer Deposition (ALD).

Example 1

The Example is illustrative of a demonstration run conducted in order to demonstrate performance of the thin-film deposition reactor 200 in terms of establishment of a laminar flow pattern in avoidance of turbulence. An exemplary AB type ALD reaction has been conducted at 300° C. for deposition of aluminum oxide ($Al_2O_3$) from two precursors, namely, trimethylaluminium (TMA) and water sequentially delivered into the reaction chamber. The amount of at least one precursor chemical supplied into said reaction has been limited to such an extent that upon propagation via the reaction chamber and between the wafer substrates (14 wafers), said chemical has ended approximately on its halfway through the wafer(s).

Figure 9:
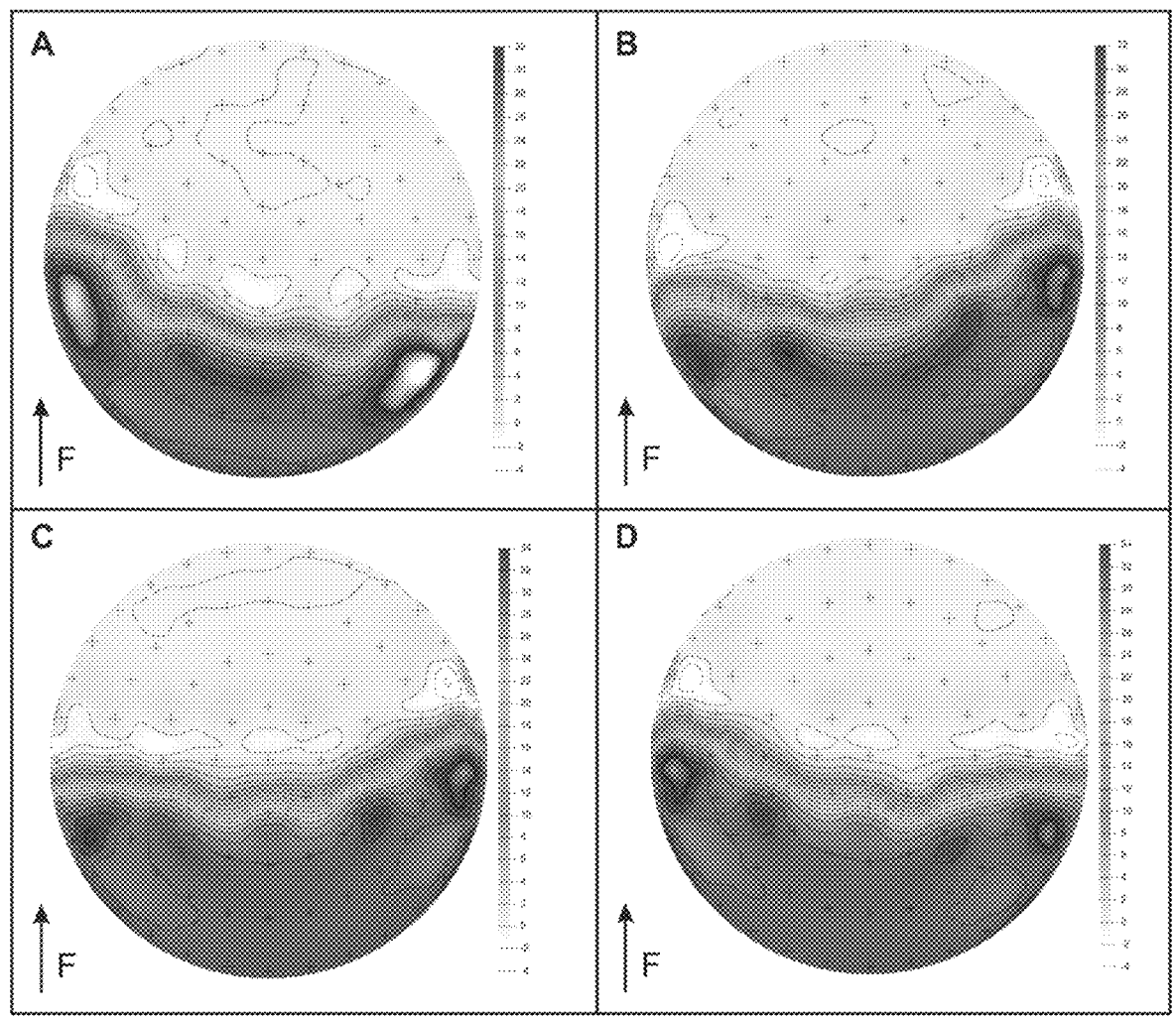
FIGS. 9 and 10 show measurement results for flow uniformity obtained upon deposition on disc-shaped wafer substrates.

FIG. 9 shows a thickness map (nm) for the aluminum oxide coating, obtained from a TMA pulse (0.1 second) for a batch of 14 wafer substrates 10 arranged as follows: 9A is a wafer in a second ($2^{nd}$) slot at a door (203) side; 9B shows a wafer in a second slot at a reaction chamber wall side opposite to the door; 9C is an eighth ($8^{th}$) wafer at a door side; and 9D is an eighth wafer at a wall side. 9A and 9B show the coating results for the wafers in the batch disposed closer to sides of the reactor chamber, whereas 9C and 9D show the results for the wafers disposed in the middle of the batch. Flow direction of precursor fluid (F) propagated through the reaction chamber is indicated by arrows (bottom to top). Both side faces of all wafers have been (partly) deposited with the $Al_2O_3$ coating (one face is shown on the maps A-D, FIG. 9).

FIG. 9 shows a border with a clear sharp outline between a coated area on the wafers A-D (a darker area) and an uncoated area on said wafers (a lighter area). The border is uniform, as it outlines the coated area of essentially same size for all wafers (side slots and middle slots), which is indicative of even propagation of the precursor fluid between all substrates in the substrate chamber. Uniform coverage of all substrate wafer indicates an absence of turbulence. That precursor chemical, propagating with the precursor fluid through the reaction chamber settles equally on all wafers in the batch, is a result of efficient mixing in the transition region of the fluid distributing device 100 and establishing laminar flow conditions in the reaction chamber to attain essentially uniform precursor fluid velocity at its leading edge.

Figure 10:
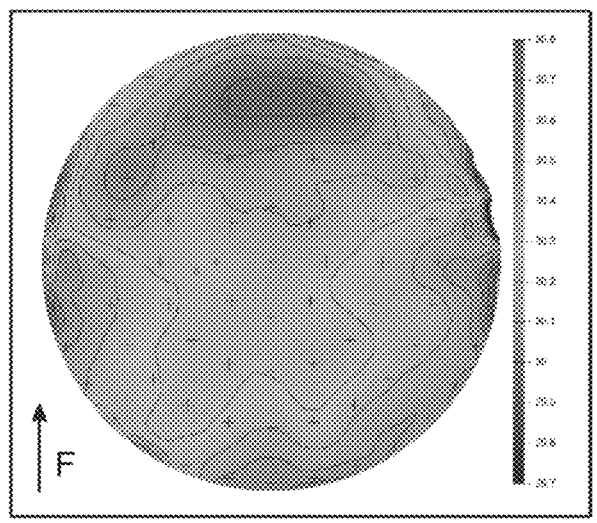

FIG. 10 shows a thickness map for (nm) for the aluminum oxide coating deposited in conditions similar to that described above, but with precursor chemical dosage adjusted to cover the entire wafer substrate. Reaction conditions have not been further optimized. According to FIG. 10, a non-uniformity rate attainable for the reaction described above constitutes, even without further optimization, less than 1%. Thus, in the map shown on FIG. 10, totally 81 points have been measured with an ellipsometer device and the non-uniformity rate constituted only 0.54%.

It shall be appreciated by those skilled in the art that the embodiments set forth in the present disclosure may be adapted and combined as desired. The disclosure is thus intended to encompass any possible modifications of devices and systems described hereby, recognizable by those of ordinary skill in the art, within a scope of appended claims.

The invention claimed is:

1. A thin-film deposition apparatus (200) comprising:
    a reaction chamber (201) for accommodating substrates (10) arranged with their side faces adjacent to each other; and
    a fluid distributing device (100), comprising an expansion region (101) with sub-regions (101-1, 101-2) into which fluid streams (F1, F2) are received via at least one inlet (103) arranged on each sub-region such that said fluid streams (F1, F2) propagate through the sub-regions in directions essentially towards one another, and a transition region (102), in which fluid streams (F1, F2) arriving thereto via the sub-regions (101-1, 101-2) combine;
wherein each sub-region (101-1, 101-2) has an interior with a distance thereacross increasing on a cross-sectional plane between each inlet (103) and the transition region (102) to an expansion width (D1) in a direction of fluid flow (F1, F2); and wherein the transition region (102) is configured to further direct a combined fluid stream into the reaction chamber (201), such that a flow (F) established at an entrance to the reaction chamber and propagating through the length of said reaction chamber, between the side faces of the substrates (10), is laminar.

2. The apparatus (200) of claim 1, comprising the fluid distributing device (100), in which a fluidic flow established in the interior of each sub-region (101-1, 101-2) at a distance between the inlet (103) and the transition region (102) is laminar.

3. The apparatus (200) of any one of claim 1 or 2, comprising the fluid distributing device (100), in which the transition region (102) is a channel (102A-102B) with an entrance (102A) and an exit (102B) provided as openings having a width (d2, d2') and a length that extends at the distance (D1) corresponding to the expansion width of each sub-region (101-1, 101-2).

4. The apparatus (200) of any preceding claim, comprising the fluid distributing device (100), in which the transition region (102) further comprises a constriction zone (104) formed by inclination of lateral surfaces (112, 121) of the channel (102A-102B) to a width (d3) essentially constant at the distance (D1).

5. The apparatus (200) of any preceding claim, comprising the fluid distributing device (100), in which at least a portion of the channel (102A-102B) has lateral surfaces inclined at a curvature.

6. The apparatus (200) of any preceding claim, comprising the fluid distributing device (100), in which the sub-regions (101-1, 101-2) of the expansion region (101) are disposed at a cross-sectional plane (P1) essentially orthogonal to a longitudinal axis (Y) of the deposition apparatus.

7. The apparatus (200) of any preceding claim, comprising the fluid distributing device (100), in which the direction of the fluid streams (F1, F2) propagating through the expansion region (101) is essentially perpendicular to the direction of fluid flow (F) propagating through the reaction chamber (201).

8. The apparatus (200) of any preceding claims 1-5, comprising the fluid distributing device (100), in which the sub-regions (101-1, 101-2) of the expansion region (101) are each disposed at cross-sectional planes (P1') and wherein each such plane (P1') is inclined by an angle (alpha, $\alpha$) with regard to the cross-sectional plane (P1).

9. The apparatus (200) of claim 8, comprising the fluid distributing device (100), in which the cross-sectional planes (P1') are mirror-symmetrical.

10. The apparatus (200) of any preceding claim, comprising the fluid distributing device (100), in which, at the transition region (102), each fluid stream (F1, F2) makes a turn from the cross-sectional plane (P1, P1') to a cross-sectional plane (P2) defined as a plane of symmetry for the sub-regions (101-1, 101-2) along the longitudinal axis (Y) of the deposition apparatus.

11. The apparatus (200) of any preceding claim, comprising the fluid distributing device (100), in which the sub-regions (101-1, 101-2) have height (h1) essentially constant across the interior thereof.

12. The apparatus (200) of any preceding claim, comprising the fluid distributing device (100) that further comprises a flow-shaping element (105) configured to adjust a flow direction of fluid streams (F1, F2) entering the transition region (102) essentially towards the reaction chamber (201).

13. The apparatus (200) of any preceding claim, comprising the fluid distributing device (100) that further comprises a mixing arrangement (106) in the transition region (102).

14. The apparatus (200) of any preceding claim, further comprising a plasma generating arrangement (107) in the fluid distributing device (100), said plasma generating arrangement being optionally disposed in the transition region (102) of the fluid distributing device.

15. The apparatus (200) of any preceding claim, wherein the reaction chamber (201) has a constant cross-section throughout its length.

16. The apparatus (200) of any preceding claim, wherein the transition region (102) is established by a channel (102A-102B) with an entrance opening (102A) and an exit opening (102B), and wherein said entrance opening and/or said exit opening have the same cross-section as the reaction chamber (201).

17. The apparatus (200) of any preceding claim, wherein an interior of the reaction chamber (201) dimensionally conforms to a predetermined number of the substrates (10) received thereinto.

18. The apparatus (200) of any preceding claim, configured to deposit material on substrate surfaces by establishing a laminar flow (F) of a precursor fluid (12) through the length of the reaction chamber (201), wherein the precursor fluid propagates between the side faces of said substrates (10) with essentially uniform velocity at a leading edge.

19. The apparatus (200) of any preceding claim, wherein the precursor fluid (12) delivered into the reaction chamber comprises at least one precursor (12X, 12A, 12B, 12C, 12D, 12E, 12F, 12G).

20. The apparatus (200) of any preceding claim, wherein the precursor fluid (12) is delivered into the reaction chamber in a number of sequential pulses.

21. The apparatus (200) of any preceding claim, configured to deposit a coating film simultaneously on all substrate surfaces.

22. The apparatus (200) of any preceding claim, further comprising an exhaust conduit (41) and an enclosure (42) arranged essentially around said exhaust conduit (41) and receiving fluid flowing from the reaction chamber (201) through the conduit (41), wherein said exhaust conduit (41) and said enclosure (42) form an exhaust assembly configured to alter a direction of exhaust flow (Fex) exiting the reaction chamber (201).

23. The apparatus of claim 22, wherein the exhaust conduit (41) and the enclosure (42) form a passage, in which exhaust flow (Fex) exiting the reaction chamber (201) via the exhaust conduit (41) makes a turn around a wall or walls forming said conduit (41), while remaining in the enclosure (42), to be further directed into an exhaust manifold (40) via an aperture (42A) arranged on at least one sidewall of the enclosure (42).

24. The apparatus (200) of any preceding claim configured as an apparatus for chemical deposition reactions.

25. The apparatus (200) of any preceding claim configured as an apparatus for Atomic Layer Deposition (ALD).

26. A method for depositing material on substrate surfaces in an apparatus for thin-film deposition, comprising:
   obtaining a thin-film deposition apparatus (200) that comprises a reaction chamber (201) for accommodating substrates (10) arranged with their side faces adjacent to each other; and a fluid distributing device (100) that comprises an expansion region (101) comprising sub-regions (101-1, 101-2) and a transition region (102);
   establishing a flow of fluid (F1, F2) into the sub-regions (101-1, 101-2) via at least one inlet (103) arranged on each sub-region such that fluid streams (F1, F2) propagate through the sub-regions in directions essentially towards one another, wherein at least one fluid stream (F1, F2) comprises at least one precursor (12X, 12A, 12B, 12C, 12D, 12E, 12F, 12G);

combining fluid streams (F1, F2) in the transition region (102), whereby a precursor fluid is formed comprising at least one precursor (12X, 12A, 12B, 12C, 12D, 12E, 12F, 12G), and further directing said precursor fluid into the reaction chamber (201); and depositing material on substrate surfaces by establishing a laminar flow (F) of precursor fluid at an entrance to the reaction chamber and maintaining said laminar flow upon propagating said precursor fluid between the side faces of the substrates (10) through the length of said reaction chamber, wherein each said sub-region (101-1, 101-2) has an interior with a distance thereacross increasing on a cross-sectional plane (P1, P1') between each inlet (103) and the transition region (102) to an expansion width (D1) in a direction of fluid flow (F1, F2).

27. The method of claim 26, wherein precursor fluid propagates between the substrates (10) with essentially uniform velocity at a leading edge.

28. Use of the apparatus (200), as defined in any one of claims 1-25 for depositing thin films of coating material on substrate surfaces.

29. A thin-film deposition system (500A, 500B, 500C, 500D) comprising a number of apparatuses (200), as defined in any one of claims 1-25, connected to one another in sequence and/or in an array.

30. The system of claim 29, in which the apparatuses (200) are arranged such, as to receive a common precursor compound (12X, 12A, 12B, 12C, 12D, 12E, 12F, 12G) into at least two apparatuses.

31. A method for uniform distribution of fluids in an apparatus for thin-film deposition, comprising:

obtaining a thin-film deposition apparatus (200) that comprises a reaction chamber (201) for accommodating substrates (10) arranged with their side faces adjacent to each other; and a fluid distributing device (100) that comprises an expansion region (101) with sub-regions (101-1, 101-2) and a transition region (102);

establishing a flow of fluid (F1, F2) into the sub-regions (101-1, 101-2) via at least one inlet (103) arranged on each sub-region such that fluid streams (F1, F2) propagate through the sub-regions in directions essentially towards one another;

combining fluid streams (F1, F2) in the transition region (102), and directing a combined fluid stream into the reaction chamber (201) such that a flow (F) established at an entrance to the reaction chamber and propagating through the length of said reaction chamber, between the side faces of the substrates (10), is laminar, wherein each said sub-region (101-1, 101-2) has an interior with a distance thereacross increasing on a cross-sectional plane (P1, P1') between each inlet (103) and the transition region (102) to an expansion width (D1) in a direction of fluid flow (F1, F2);

wherein an interior of the reaction chamber (201) dimensionally conforms to a predetermined number of substrates (10) received thereinto; and wherein, at the transition region (102), each fluid stream (F1, F2) makes a turn from the cross-sectional plane (P1, P1') to a cross-sectional plane (P2) defined as a plane of symmetry for the sub-regions (102-1, 102-2) along a longitudinal axis (Y) of the deposition apparatus.

\* \* \* \* \*

UNITED STATES PATENT AND TRADEMARK OFFICE
CERTIFICATE OF CORRECTION

PATENT NO. : 10,982,325 B2
APPLICATION NO. : 17/029320
DATED : April 20, 2021
INVENTOR(S) : Kostamo et al.

It is certified that error appears in the above-identified patent and that said Letters Patent is hereby corrected as shown below:

In the Claims

Delete all Claims 1-31, Column 24, Line 50 to Column 28, Line 33, and replace with the following:

--1. A thin-film deposition apparatus (200) comprising:
- a reaction chamber (201) for accommodating substrates (10) arranged with their side faces adjacent to each other; and
- a fluid distributing device (100), comprising an expansion region (101) with sub-regions (101-1, 101-2) into which fluid streams (Fl, F2) are received via at least one inlet (103) arranged on each sub-region such that said fluid streams (Fl, F2) propagate through the sub-regions in directions essentially towards one another, and a transition region (102), in which fluid streams (Fl, F2) arriving thereto via the sub-regions (101-1, 101-2) combine;
wherein each sub-region (101-1, 101-2) has an interior with a distance thereacross increasing on a cross-sectional plane between each inlet (103) and the transition region (102) to an expansion width (Dl) in a direction of fluid flow (Fl, F2); and
wherein the transition region (102) is configured to further direct a combined fluid stream into the reaction chamber (201), such that a flow (F) established at an entrance to the reaction chamber and propagating through the length of said reaction chamber, between the side faces of the substrates (10), is laminar.

2. The apparatus (200) of claim 1, comprising the fluid distributing device (100), in which a fluidic flow established in the interior of each sub-region (101-1, 101-2) at a distance between the inlet (103) and the transition region (102) is laminar.

3. The apparatus (200) of claim 1, comprising the fluid distributing device (100), in which the transition region (102) is a channel (102A-102B) with an entrance (102A) and an exit (102B) provided as openings having a width (d2, d2') and a length that extends at the distance (D1) corresponding to the expansion width of each sub-region (101-1, 101-2).

Signed and Sealed this
Third Day of December, 2024

*Katherine Kelly Vidal*
Katherine Kelly Vidal
*Director of the United States Patent and Trademark Office*

4. The apparatus (200) of claim 1, comprising the fluid distributing device (100), in which the transition region (102) further comprises a constriction zone (104) formed by inclination of lateral surfaces (112, 121) of the channel (102A-102B) to a width (d3) essentially constant at the distance (Dl).

5. The apparatus (200) of claim 1, comprising the fluid distributing device (100), in which at least a portion of the channel (102A-102B) has lateral surfaces inclined at a curvature.

6. The apparatus (200) of claim 1, comprising the fluid distributing device (100), in which the sub-regions (101-1, 101-2) of the expansion region (101) are disposed at a cross-sectional plane (Pl) essentially orthogonal to a longitudinal axis (Y) of the deposition apparatus.

7. The apparatus (200) of claim 1, comprising the fluid distributing device (100), in which the direction of the fluid streams (Fl, F2) propagating through the expansion region (101) is essentially perpendicular to the direction of fluid flow (F) propagating through the reaction chamber (201).

8. The apparatus (200) of claim 1, comprising the fluid distributing device (100), in which the sub-regions (101-1, 101-2) of the expansion region (101) are each disposed at cross-sectional planes (Pl') and wherein each such plane (Pl') is inclined by an angle (alpha, a) with regard to the cross-sectional plane (Pl).

9. The apparatus (200) of claim 8, comprising the fluid distributing device (100), in which the cross-sectional planes (Pl') are mirror-symmetrical.

10. The apparatus (200) of claim 1, comprising the fluid distributing device (100), in which, at the transition region (102), each fluid stream (Fl, F2) makes a turn from the cross-sectional plane (Pl, Pl') to a cross-sectional plane (P2) defined as a plane of symmetry for the sub-regions (101-1, 101-2) along the longitudinal axis (Y) of the deposition apparatus.

11. The apparatus (200) of claim 1, comprising the fluid distributing device (100), in which the sub-regions (101-1, 101-2) have height (hi) essentially constant across the interior thereof.

12. The apparatus (200) of claim 1, comprising the fluid distributing device (100) that further comprises a flow-shaping element (105) configured to adjust a flow direction of fluid streams (Fl, F2) entering the transition region (102) essentially towards the reaction chamber (201).

13. The apparatus (200) of claim 1 comprising the fluid distributing device (100) that further comprises a mixing arrangement (106) in the transition region (102).

14. The apparatus (200) of claim 1, further comprising a plasma generating arrangement (107) in the fluid distributing device (100), said plasma generating arrangement being optionally disposed in the transition region (102) of the fluid distributing device.

15. The apparatus (200) of claim 1, wherein the reaction chamber (201) has a constant cross-section throughout its length.

16. The apparatus (200) of claim 1, wherein the transition region (102) is established by a channel (102A-102B) with an entrance opening (102A) and an exit opening (102B), and wherein said entrance opening and/or said exit opening have the same cross-section as the reaction chamber (201).

17. The apparatus (200) of claim 1, wherein an interior of the reaction chamber (201) dimensionally conforms to a predetermined number of the substrates (10) received thereinto.

18. The apparatus (200) of claim 1, configured to deposit material on substrate surfaces by establishing a laminar flow (F) of a precursor fluid (12) through the length of the reaction chamber (201), wherein the precursor fluid propagates between the side faces of said substrates (10) with essentially uniform velocity at a leading edge.

19. The apparatus (200) of claim 1, wherein the precursor fluid (12) delivered into the reaction chamber comprises at least one precursor (12X, 12A, 12B, 12C, 12D, 12E, 12F, 12G).

20. The apparatus (200) of claim 1, wherein the precursor fluid (12) is delivered into the reaction chamber in a number of sequential pulses.

21. The apparatus (200) of claim 1, configured to deposit a coating film simultaneously on all substrate surfaces.

22. The apparatus (200) of claim 1, further comprising an exhaust conduit (41) and an enclosure (42) arranged essentially around said exhaust conduit (41) and receiving fluid flowing from the reaction chamber (201) through the conduit (41), wherein said exhaust conduit (41) and said enclosure (42) form an exhaust assembly configured to alter a direction of exhaust flow (Fex) exiting the reaction chamber (201).

23. The apparatus of claim 21, wherein the exhaust conduit (41) and the enclosure (42) form a passage, in which exhaust flow (Fex) exiting the reaction chamber (201) via the exhaust conduit (41) makes a turn around a wall or walls forming said conduit (41), while remaining in the enclosure (42), to be further directed into an exhaust manifold (40) via an aperture (42A) arranged on at least one sidewall of the enclosure (42).

24. The apparatus (200) of claim 1, configured as an apparatus for chemical deposition reactions.

25. The apparatus (200) of claim 1, configured as an apparatus for Atomic Layer Deposition (ALO).

26. A method for depositing material on substrate surfaces in an apparatus for thi•t film deposition, comprising:
    obtaining a thin-film deposition apparatus (200) that comprises a reaction chamber (201) for accommodating substrates (10) arranged with their side faces adjacent to each other; and a fluid distributing device (100) that comprises an expansion region (101) comprising sub-regions (101-1, 101-2) and a transition region (102);
    establishing a flow of fluid (Fl, F2) into the sub-regions (101-1, 101-2) via at least one inlet (103) arranged on each sub-region such that fluid streams (Fl, F2) propagate through the sub-regions in directions essentially towards one another, wherein at least one fluid stream (Fl, F2) comprises at least one precursor (12X, 12A, 12B, 12C, 12D, 12E, 12F, 12G);

combining fluid streams (Fl, F2) in the transition region (102), whereby a precursor fluid is formed comprising at least one precursor (12X, 12A, 12B, 12C, 12D, 12E, 12F, 12G), and further directing said precursor fluid into the reaction chamber (201); and depositing material on substrate surfaces by establishing a laminar flow (F) of precursor fluid at an entrance to the reaction chamber and maintaining said laminar flow upon propagating said precursor fluid between the side faces of the substrates (10) through the length of said reaction chamber, wherein each said sub-region (101-1, 101-2) has an interior with a distance thereacross increasing on a cross-sectional plane (Pl, Pl') between each inlet (103)

and the transition region (102) to an expansion width (Dl) in a direction of fluid flow (Fl, F2).

27. The method of claim 25, wherein precursor fluid propagates between the substrates (10) with essentially uniform velocity at a leading edge.

28. Use of the apparatus (200), as defined in claim 1 for depositing thin films of coating material on substrate surfaces.

29. A thin-film deposition system (500A, 5008, 500C, SOOD) comprising a number of apparatuses (200), as defined in claim 1, connected to one another in sequence and/or in an array.

30. The system of claim 29, in which the apparatuses (200) are arranged such, as to receive a common precursor compound (12X, 12A, 12B, 12C, 12D, 12E, 12F, 12G) into at least two apparatuses.

31. A method for uniform distribution of fluids in an apparatus for thin-film deposition, comprising: obtaining a thin-film deposition apparatus (200) that comprises a reaction chamber (201) for
 accommodating substrates (10) arranged with their side faces adjacent to each other; and a
 fluid distributing device (100) that comprises an expansion region (101) with sub-regions
 (101-1, 101-2) and a transition region (102);
  establishing a flow of fluid (Fl, F2) into the sub-regions (101-1, 101-2) via at least one inlet (103) arranged on each sub-region such that fluid streams (Fl, F2) propagate through the sub-regions in directions essentially towards one another;
 combining fluid streams (Fl, F2) in the transition region (102), and
  directing a combined fluid stream into the reaction chamber (201) such that a flow (F) established at an entrance to the reaction chamber and propagating through the length of said reaction chamber, between the side faces of the substrates (10), is laminar,
  wherein each said sub-region (101-1, 101-2) has an interior with a distance thereacross increasing on a cross-sectional plane (Pl, Pl') between each inlet (103) and the transition region (102) to an expansion width (Dl) in a direction of fluid flow (Fl, F2);
  wherein an interior of the reaction chamber (201) dimensionally conforms to a predetermined number of substrates (10) received thereinto; and
  wherein, at the transition region (102), each fluid stream (Fl, F2) makes a turn from the cross-sectional plane (Pl, Pl') to a cross-sectional plane (P2) defined as a plane of symmetry for the sub-regions (102-1, 102-2) along a longitudinal axis (Y) of the deposition apparatus.--